(12) United States Patent
Lu et al.

(10) Patent No.: US 12,361,998 B2
(45) Date of Patent: Jul. 15, 2025

(54) SUSTAINABLE DRAM HAVING PRINCIPLE POWER SUPPLY VOLTAGE UNIFIED WITH LOGIC CIRCUIT

(71) Applicant: ETRON TECHNOLOGY, INC., Hsinchu (TW)

(72) Inventors: Chao-Chun Lu, Taipei (TW); Bor-Doou Rong, Zhubei (TW); Chun Shiah, Hsinchu (TW)

(73) Assignees: Invention And Collaboration Laboratory Pte. Ltd., Singapore (SG); Etron Technology, Inc., Hsinchu (TW)

( * ) Notice: Subject to any disclaimer, the term of this patent is extended or adjusted under 35 U.S.C. 154(b) by 0 days.

(21) Appl. No.: 17/333,836

(22) Filed: May 28, 2021

(65) Prior Publication Data

US 2021/0295893 A1    Sep. 23, 2021

Related U.S. Application Data

(63) Continuation-in-part of application No. 16/354,187, filed on Mar. 15, 2019, now Pat. No. 11,302,383.

(Continued)

(51) Int. Cl.
*G11C 11/4074* (2006.01)
*G11C 11/4096* (2006.01)

(52) U.S. Cl.
CPC ...... *G11C 11/4074* (2013.01); *G11C 11/4096* (2013.01)

(58) Field of Classification Search
CPC .. G11C 11/4091; G11C 11/4085; G11C 11/24

(Continued)

(56) References Cited

U.S. PATENT DOCUMENTS 5,353,255 A    10/1994    Komuro
5,675,529 A    10/1997    Poole
(Continued)

FOREIGN PATENT DOCUMENTS

JP    2000-164813 A    6/2000
JP    2000-339961 A    12/2000
(Continued)

OTHER PUBLICATIONS

Kyungjun Cho et al., Signal Integrity Design and Analysis of Silicon Interposer for GPU-Memory Channels in High-Bandwidth Memory Interface, IEEE Transactions on Components, Packaging and Manufacturing Technology, vol. 8, No. 9, Sep. 2018, pp. 1658-1671 ,Sep. 2018.

*Primary Examiner* — Anthan Tran
(74) *Attorney, Agent, or Firm* — Winston Hsu

(57) ABSTRACT

This invention discloses sustainable DRAM with principle power supply voltage which is unified with an external logic circuit. The DRAM circuit is configured to couple with the external logic circuit and with a principle power supply voltage source. The DRAM circuit comprises a first sustaining voltage generator and a DRAM core circuit. The first sustaining voltage generator generates a first voltage level which is higher than a voltage level corresponding to a signal ONE utilized in the DRAM circuit. The DRAM core circuit has a DRAM cell comprising an access transistor and a storage capacitor, and the storage capacitor of the DRAM cell is configured to selectively coupled to the first sustaining voltage generator. Wherein, a voltage level of the principle power supply voltage source to the DRAM circuit is the same or substantially the same as that of a principle power supply voltage source to the external logic circuit.

22 Claims, 20 Drawing Sheets

Related U.S. Application Data

(60) Provisional application No. 62/777,727, filed on Dec. 10, 2018.

(58) Field of Classification Search
USPC .................................................. 365/189.11
See application file for complete search history.

(56) References Cited

U.S. PATENT DOCUMENTS

| | | | |
|---|---|---|---|
| 5,732,026 A | 3/1998 | Sugibayashi | |
| 5,808,930 A * | 9/1998 | Wada | G11C 5/14 |
| | | | 365/51 |
| 5,978,255 A | 11/1999 | Naritake | |
| 5,986,914 A | 11/1999 | McClure | |
| 5,995,403 A | 11/1999 | Naritake | |
| 6,141,259 A | 10/2000 | Scott | |
| 6,272,054 B1 | 8/2001 | Barth, Jr. | |
| 6,341,100 B1 | 1/2002 | Fujioka | |
| 6,344,990 B1 | 2/2002 | Matsumiya | |
| 6,636,454 B2 | 10/2003 | Fujino | |
| 8,559,220 B2 * | 10/2013 | Yamazaki | H01L 27/105 |
| | | | 365/72 |
| 2003/0133321 A1 | 7/2003 | Jo | |
| 2003/0174545 A1 | 9/2003 | Wada | |
| 2004/0243758 A1 | 12/2004 | Notani | |
| 2005/0247997 A1 | 11/2005 | Chung | |
| 2006/0114739 A1 * | 6/2006 | Worley | G11C 5/145 |
| | | | 365/189.11 |
| 2006/0221746 A1 | 10/2006 | Kang | |
| 2006/0233024 A1 | 10/2006 | Matick | |
| 2007/0085601 A1 * | 4/2007 | Idei | G11C 5/147 |
| | | | 327/558 |
| 2007/0187814 A1 * | 8/2007 | Cusack | H01L 23/5286 |
| | | | 257/E23.079 |
| 2007/0195624 A1 | 8/2007 | Song | |
| 2008/0159036 A1 | 7/2008 | Leung | |
| 2009/0231939 A1 | 9/2009 | Hsu | |
| 2009/0251975 A1 * | 10/2009 | Chung | G11C 11/4091 |
| | | | 365/189.11 |
| 2010/0202220 A1 | 8/2010 | Hsu | |
| 2010/0329051 A1 | 12/2010 | Demone | |
| 2014/0254241 A1 * | 9/2014 | Shiimoto | H10B 63/30 |
| | | | 365/148 |
| 2016/0163364 A1 | 6/2016 | Lee | |
| 2016/0307616 A1 | 10/2016 | Rim | |
| 2016/0372162 A1 | 12/2016 | Choi | |
| 2020/0185022 A1 | 6/2020 | Lu | |
| 2020/0185388 A1 | 6/2020 | Lu | |
| 2022/0246192 A1 | 8/2022 | Lu | |

FOREIGN PATENT DOCUMENTS

| | | |
|---|---|---|
| JP | 2003-228981 A | 8/2003 |
| JP | 2010-186534 A | 8/2010 |
| KR | 10-2015-0137250 A | 12/2015 |
| KR | 10-2016-0148346 A | 12/2016 |
| KR | 10-2017-0055596 A | 5/2017 |

* cited by examiner

SUSTAINABLE DRAM HAVING PRINCIPLE POWER SUPPLY VOLTAGE UNIFIED WITH LOGIC CIRCUIT

CROSS REFERENCE TO RELATED APPLICATIONS

This application is a continuation-in-part of U.S. patent application Ser. No. 16/354,187, filed on Mar. 15, 2019 and entitled "DYNAMIC MEMORY WITH SUSTAINABLE STORAGE ARCHITECTURE", which claims priority under 35 U.S.C. 119 (e) to U.S. Provisional Application No. 62/777,727, filed on Dec. 10, 2018, all of which are hereby expressly incorporated by reference into the present application.

BACKGROUND OF THE INVENTION

1. Field of the Invention

The present invention relates to dynamic memory, especially to sustainable dynamic memory having a principle power supply voltage unified or compatible with the external logic circuit.

2. Description of the Prior Art

The most widely used DRAM cell has one access transistor which has its source connected to the storage capacitor and its drain connected to the bit-line. The bit-line is connected to the first-stage cross-coupled sense amplifier which transfer signals to be READ out from the cell-array through the column switches to a second-stage sense amplifier which is connected to the I/O lines (also known as Data lines). During WRITE operation the signals driven by I/O buffers to be stabilized on the Data lines which further stabilize the data over the first-stage sense amplifier to make the right signals written into the storage capacitor through the access transistor. The access transistor is responsible for READ operation or WRITE operation of the correct data into the storage capacitor during active mode (that is, the access transistor is ON) but also avoids the stored signal loss when the access transistor is during the inactive mode (that is, the access transistor is OFF).

The access transistor is designed to have a high threshold voltage to minimize the leakage current through the transistor. But the shortcoming result is that the access transistor loses its performance when it is turned ON. As a result, the word-line needs to be bootstrapped or connected to a high VPP (usually from a word-line voltage source) to allow the access transistor to have high drivability for WRITE of signals into the storage capacitor. Such a high VPP is passed through a word-line driver to be loaded onto the word-line or the gate of the access transistor. Since the VPP is a high voltage stress over the access transistor, the dielectric material of the transistor (for example, an oxide layer or a High-K material) must be designed to be thicker than that used for transistors used in other support circuits or peripheral circuits of DRAM (such as command decoder, address decoder, and other I/O circuits, etc.) Therefore, the design of the access transistor faces a challenge of maintaining either high performance or high reliability, and presents a difficult trade-off between reliability and performance. The widely used access transistor design is more focused on accomplishing high reliability but must sacrifice the performance of the access transistor.

In a brief summary, regarding the conventional access transistor design, it has a high threshold voltage to reduce the leakage current to help long retention time of retaining charges in the storage capacitor, a thick gate dielectric material to sustain the high word-line voltage like VPP, and sacrifices the performance of the access transistor. As a result, WRITE or READ of the signal ONE which is usually referred to a VCC level takes longer times or cannot completely restore the signal ONE. That is, the WRITE time is longer to satisfy the full-signal VCC to be completely written into the storage capacitor.

The commonly used design of the DRAM cell could be illustrated in FIG. 1A. The DRAM cell includes an access transistor 11 and a capacitor 12. The gate of the access transistor 11 is coupled to a word-line (WL) and the cross-coupled sense amplifier 20 is coupled to the access transistor 11 through the bit-line (BL). The DRAM cell uses the access transistor 11 as a switch to control the charges to be stored from the bit-line (BL) into the capacitor in WRITE mode or to be transferred out to bit-line in READ mode, where multiple DRAM cells are connected to the bit-line, respectively. In this example, there are signals ONE (supposed as 1.2 V, and the signal ONE is usually corresponding to the level voltage of VCCSA provided from the cross-coupled sense amplifier 20) and ZERO (supposed as 0V, and the signal ZERO is usually corresponding to the level voltage of VSS provided from the cross-coupled sense amplifier 20) latched by a cross-coupled sense amplifier in READ mode by amplifying the signals transferred out by the cell signals on bit-lines, or these signals ONE and ZERO are written from the external to twist the sense amplifier for storing the right signals to the cells in WRITE mode.

FIG. 1B shows the related signal waveforms during access (READ or WRITE) operations of most current DRAMs. To give an example, a 25-nanometer DRAM cell has commonly the following parameters related to (surrounded with) the array design: the bit-line ONE voltage 1.2V, the word-line ON has the VPP up to 2.7V and the word-line OFF has the voltage about −0.3V, the threshold voltage of the cell is ranged around 0.7 to 0.9 V, the access transistor's dielectric must sustain the field strength under 2.7 V (under burn-in stress this number goes up to 3.4V for an acceptable reliability margin), and the Word-line driver device must also use the thick gate dielectric so that the performance must be sacrificed.

As shown in FIG. 1B, in the beginning, the storage capacitor of the DRAM is in the standby or inactive mode (that is, the access transistor is OFF), the voltage level of the word-line coupled to the gate of the access transistor is a standby negative voltage (−0.3V). The bit-line and bit-line bar are equalized at a voltage level of half-VCCSA between the ONE level at VCCSA=1.2V and the ZERO level of 0 V. When the DRAM cell enters the active mode (that is, the access transistor is ON), the voltage level of the word-line is raised from a standby negative voltage (−0.3V) and pulled up to a high level VPP (such as 2.7 V) which is much higher than the VCCSA (1.2 V) plus the threshold voltage VT of the access transistor (could be 0.7 or 0.8V) to provide sufficiently large drive over the access transistor's Gate-to-Source voltage (e.g. 2.7 V−1.2 V−0.8 V=0.7 V). The bit-line is coupled to the storage capacitor. The word-line is continuously ON at such a high voltage VPP for access operation (such as READ or WRITE). A RESTORE phase is proceeded following the access operation. During the RESTORE phase, the cross-coupled sense amplifier will recharge the storage capacitor based on the signal ONE or ZERO in the storage capacitor. After the RESTORE phase, the word-line is pulled down from VPP to the voltage of word-line at standby mode (−0.3 V) and the access transistor is in the inactive mode.

This high VPP voltage stress causes the access transistor to be designed with a thicker gate-oxide or gate-insulator than that used for the transistors in peripheral circuits, which degrades the access transistor performances such as the worse short-channel effects, the ON-OFF ratio of the transistor currents, and the swing slopes, etc. Moreover, although the threshold voltage is designed to be higher than that used in the transistors of peripheral circuits, the leakage current through the access transistor during the standby mode or inactive mode is still high to degrade the amount of stored charges for sensing. When the VCCSA is lower (such as 0.6V) in 12 nm or 7 nm process, the leakage problem in the standby mode or inactive mode will be worse. Therefore, the principle power supply voltage to DRAM or the VCCSA voltage in the transitional DRAM shall be maintained at a certain voltage level.

On the other hand, an IC system for high performance computing or artificial intelligence (AI) system is composed of a plurality of DRAM chips and a logic chip. The logic chip now could be made in silicon die by using a 10-nanometers process node, or a 7-nanometers process node and toward a 5-nanometers process node. These process nodes basically follow the Moore's Law by device scaling design to increase 2 times of transistors in a specified area per each process node. But the key contribution to be able to follow the Moore's Law is due to the invention and execution of 3D transistor structures (e.g. gate around, Tri-gate or FINFET). The 3D shaped or structured transistor does deliver high performance, low leakage and high reliability, etc.

However, the DRAM technology scaling was slowed down after 45 nanometer process node and the introduction of 1× nm after the 25 nanometer process node takes much longer than the two years per process node which did happen in the DRAM history following the Moore's Law's prediction. A key reason is that the DRAM's using stacked capacitor structure which needs high temperature processing steps after the transistor structure has been formed and thus the transistor's source and drain junctions are hard to be controlled as shallow as the transistor scaling rules require. As a result, most DRAM products do not use the process technology which is the same as that widely used in the Logic process for sub-20 nanometer process nodes.

To be worse, when the Logic/SOC performance can be highly accelerated by sub-10 nanometer processing and design technologies, especially due to the use and improvement of the 3D Tri-gate transistor structures, the sloweddown DRAM technology migration makes the worse wellknown Memory-Wall effect (actually DRAM-Wall) which reduces the data transfer rate between logic and memory. The data bandwidth and random access time are both getting a larger and larger performance gap: the conventional DRAM just cannot perform as a memory vehicle to provide or to store data to the Logic/SOC chip.

In order to solve the memory-wall problem, the DRAM technology development is led to a 3D-DRAM technology called high-bandwidth DRAM (HBM). However, in the HBM standard published by the Joint Electron Device Engineering Council (JEDEC), a principle power supply voltage or principle supply voltage Vdd of the DRAM chip is defined at 1.2V. Such principle power supply voltage is external to the DRAM chip. On the other hand, a principle power supply voltage of the tri-gate transistor used in the logic chip is at 0.6 to 0.7V. As shown in FIG. 1C, the DRAM circuit 100 includes an I/O circuit 110 (comprising signal level converting circuit, driving impedance tuning circuit, etc.), a peripheral circuit 120 (comprising command/address decoders, etc.), and a DRAM core circuit 130 (comprising cell arrays, etc.). To communicate with a logic circuit 300 (such as a memory controller), there is a physical layer circuit (sometimes called PHY layer) 200 between the DRAM 100 and the logic circuit 300, wherein the physical layer circuit 200 further includes an I/O physical circuit 210 (also comprising signal level converting circuit, driving impedance tuning circuit, etc.) and a logic physical circuit 220 communicating with the logic circuit 300. Due to the slowed-down DRAM technology migration and leakage problem in the DRAM circuit 100, the external principle power supply voltage Va to DRAM circuit 100 could be be in the range of 2.5V~1.1V, but the external principle power supply voltage Va' to the logic circuit 300 could be in the range of 0.9V~0.6V, for example. The principle power supply voltage Va is external to DRAM circuit 100 and could be used by DRAM circuit 100 to produce various voltage sources, such as the previously mentioned voltage sources VCCSA, 1/2VCCSA, VPP, etc. The level of the VCCSA could be the same as or different from that of Va.

Since the difference between the principle power supply voltage Va to DRAM circuit 100 and the principle power supply voltage Va' to the logic circuit 300, as shown in FIG. 1D, in the transitional DRAM circuit, the I/O circuit 110 of the DRAM circuit 100 will include an output level converting circuit to level up or level down the voltage level of the output signal from the DRAM circuit 100 to be a predetermined level which is acceptable by the I/O physical circuit 210 of the physical layer circuit 200. Moreover, the I/O circuit 110 further includes an input comparator which will compare the input signal from the physical layer circuit 200 with a reference voltage Vref, and convert to a corresponding signal. Similarly, as shown in FIG. 1E, the I/O physical circuit 210 of the physical layer circuit 200 also includes an output level converting circuit to level up or level down the voltage level of the output signal from the physical layer circuit 200 to be a predetermined level which is acceptable by the I/O circuit 110 of the DRAM circuit 100, and further includes an input comparator to compare the input signal from the DRAM circuit 100 with another reference voltage Vref' and convert to a corresponding signal. Those incompatibility of the principle power supply voltages between DRAM chip and the logic chip leads to difficulties in optimization of the energy efficiency and performance synchronization.

SUMMARY OF THE INVENTION

Therefore, the present invention is to introduce sustainable DRAM chip having a principle power supply voltage which is unified with an external logic circuit. According to an aspect of the invention, the DRAM chip comprises a first sustaining voltage generator and a DRAM core circuit. The first sustaining voltage generator generates a first voltage level which is higher than a voltage level corresponding to a signal ONE utilized in the DRAM chip. The DRAM core circuit has a DRAM cell comprising an access transistor and a storage capacitor, and the storage capacitor of the DRAM cell is configured to selectively coupled to the first sustaining voltage generator. Wherein, a voltage level of the principle power supply voltage source to the DRAM chip is the same or substantially the same as that of a principle power supply voltage source to the external logic circuit.

According to one aspect of the invention, the voltage level of the external principle power supply voltage source to the DRAM chip is not greater than 0.9V, for example, the voltage level of the external principle power supply voltage source to the DRAM chip is between 0.9V~0.5V, or even lower.

According to one aspect of the invention, the DRAM chip further comprises an I/O circuit and a peripheral circuit between the I/O circuit and the DRAM core circuit, wherein the I/O circuit is without an input comparator circuit and an output level converting circuit.

According to one aspect of the invention, an operation supply voltage to a drain side of a transistor in the peripheral circuit is the same as the voltage level of the principle power supply voltage source to the DRAM chip. Moreover, an operation supply voltage to a drain side of a transistor in the DRAM core circuit which is not the access transistor is the same as the voltage level of the principle power supply voltage source to the DRAM chip. Furthermore, the voltage level corresponding to the signal ONE utilized in the DRAM chip is the same as the voltage level of the principle power supply voltage source to the DRAM chip.

According to one aspect of the invention, the DRAM chip further comprises an I/O circuit and a peripheral circuit between the I/O circuit and the DRAM core circuit, wherein an output data signal from the peripheral circuit to the I/O circuit is not leveled up or down by the I/O circuit, and an input data signal from the external logic circuit to the DRAM chip is not compared with a reference voltage to generate a corresponding signal by the I/O circuit.

According to one aspect of the invention, the DRAM chip further comprises a word line coupled to a gate terminal of the access transistor, wherein the word-line is selected to turn on the access transistor for a first period and a second period which is after the first period, and the first sustaining voltage generator is electrically coupled to the storage capacitor of the DRAM cell during the second period. Moreover, the first period is an access operation period, and the second period is a restore phase period. Furthermore, a kicking charge source is electrically coupled to a bit line of the DRAM chip during the access operation period.

According to another object of the invention, this invention provides a DRAM chip configured to couple with an external logic circuit and with a principle power supply voltage source. The DRAM chip comprises a DRAM core circuit, an I/O circuit, and a peripheral circuit between the I/O circuit and the DRAM core circuit. The DRAM core circuit has a DRAM cell comprising an access transistor and a storage capacitor, and the I/O circuit is configured to couple to the external logic circuit. Wherein a voltage level of the principle power supply voltage source to the DRAM chip is the same or substantially the same as that of a principle power supply voltage source to the external logic circuit, and the voltage level of the external principle power supply voltage source to the DRAM chip is not greater than 0.9V.

According to one aspect of the invention, an operation supply voltage to a drain side of a transistor in the peripheral circuit is the same as the voltage level of the principle power supply voltage source to the DRAM chip. Moreover, an operation supply voltage to a drain side of a transistor in the DRAM core circuit which is not the access transistor is the same as the voltage level of the principle power supply voltage source to the DRAM chip. Furthermore, the voltage level corresponding to the signal ONE utilized in the DRAM chip is the same as the voltage level of the principle power supply voltage source to the DRAM chip. Moreover, the I/O circuit excludes or skips an input comparator circuit and an output level converting circuit.

According to one aspect of the invention, the DRAM chip further comprises a first sustaining voltage generator and a word line coupled to a gate terminal of the access transistor. The first sustaining voltage generator produces a first voltage level which is higher than a voltage level corresponding to a signal ONE utilized in the DRAM chip. The word-line is selected to turn on the access transistor for a first period and a second period which is after the first period, and the first sustaining voltage generator is electrically coupled to the storage capacitor of the DRAM cell during the second period. Moreover, the first period is an access operation period, the second period is a restore phase period.

Another object of the invention is to provide a memory system with unified supply power voltage comprising a DRAM chip and a logic chip electrically coupled to the DRAM chip. Wherein a voltage level of a principle power supply voltage source to the DRAM chip is the same or substantially the same as that of a principle power supply voltage source to the logic chip, and the voltage level of the principle power supply voltage source to the DRAM chip is not greater than 0.9V.

According to one aspect of the invention, the DRAM chip includes a DRAM circuit, the logic chip includes a logic circuit and a physical layer circuit. Wherein the principle power supply voltage source to the DRAM chip is supplied to the DRAM circuit, and the principle power supply voltage source to the logic chip is supplied to the logic circuit and the physical layer circuit.

According to one aspect of the invention, the memory system with unified supply power voltage further comprises a based chip electrically coupled to the DRAM chip. Wherein the voltage level of the principle power supply voltage source to the DRAM chip is the same or substantially the same as that of a principle power supply voltage source to the based chip.

According to one aspect of the invention, the DRAM chip includes a DRAM circuit, the logic chip includes a logic circuit, and the based chip includes a physical layer circuit. Wherein the principle power supply voltage source to the DRAM chip is supplied to the DRAM circuit, the principle power supply voltage source to the logic chip is supplied to the logic circuit, and the principle power supply voltage source to the based chip is supplied to the physical layer circuit.

According to one aspect of the invention, the DRAM chip comprises a DRAM cell and a first sustaining voltage generator. The DRAM cell comprises a storage capacitor and an access transistor, and the first sustaining voltage generator produces a first voltage level which is higher than a voltage level corresponding to a signal ONE utilized in the DRAM chip. Wherein the first sustaining voltage generator is coupled to the storage capacitor of the DRAM cell before the access transistor of the DRAM cell is turned off.

According to one aspect of the invention, the DRAM chip further comprises an I/O circuit and a peripheral circuit between the I/O circuit and the DRAM cell, the I/O circuit is without an input comparator circuit and an output level converting circuit.

According to one aspect of the invention, a physical layer circuit of the memory system comprises an I/O physical circuit, and the I/O physical circuit is without an input comparator circuit and an output level converting circuit.

These and other objectives of the present invention will no doubt become obvious to those of ordinary skill in the art after reading the following detailed description of the preferred embodiment that is illustrated in the various figures and drawings.

DETAILED DESCRIPTION

A detailed description of the hereinafter described embodiments of the disclosed apparatus and method are presented herein by way of exemplification and not limitation with reference to the figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

This invention is to disclose DRAM with sustainable storage architecture, in which a sustaining voltage source is electrically coupled to the storage capacitor of the DRAM cell before the turn off of the access transistor, and the voltage level of the sustaining voltage source is higher than that of the regular signal ONE; or the voltage level of the sustaining voltage source is lower than that of the regular signal ZERO. DRAM operations (such as auto-precharge operation, RESTORE phase, and precharge phase) will make the selected DRAM cell to turn on the access transistor thereof. Thus, by coupling the aforesaid sustaining voltage source to the storage capacitor of the DRAM cell during the turn on stage of the access transistor, the storage capacitor can sustain for a longer period compared with conventional DRAM structure after the turn off stage of the access transistor, even if there is leakage current through the access transistor.

Figure 1A:
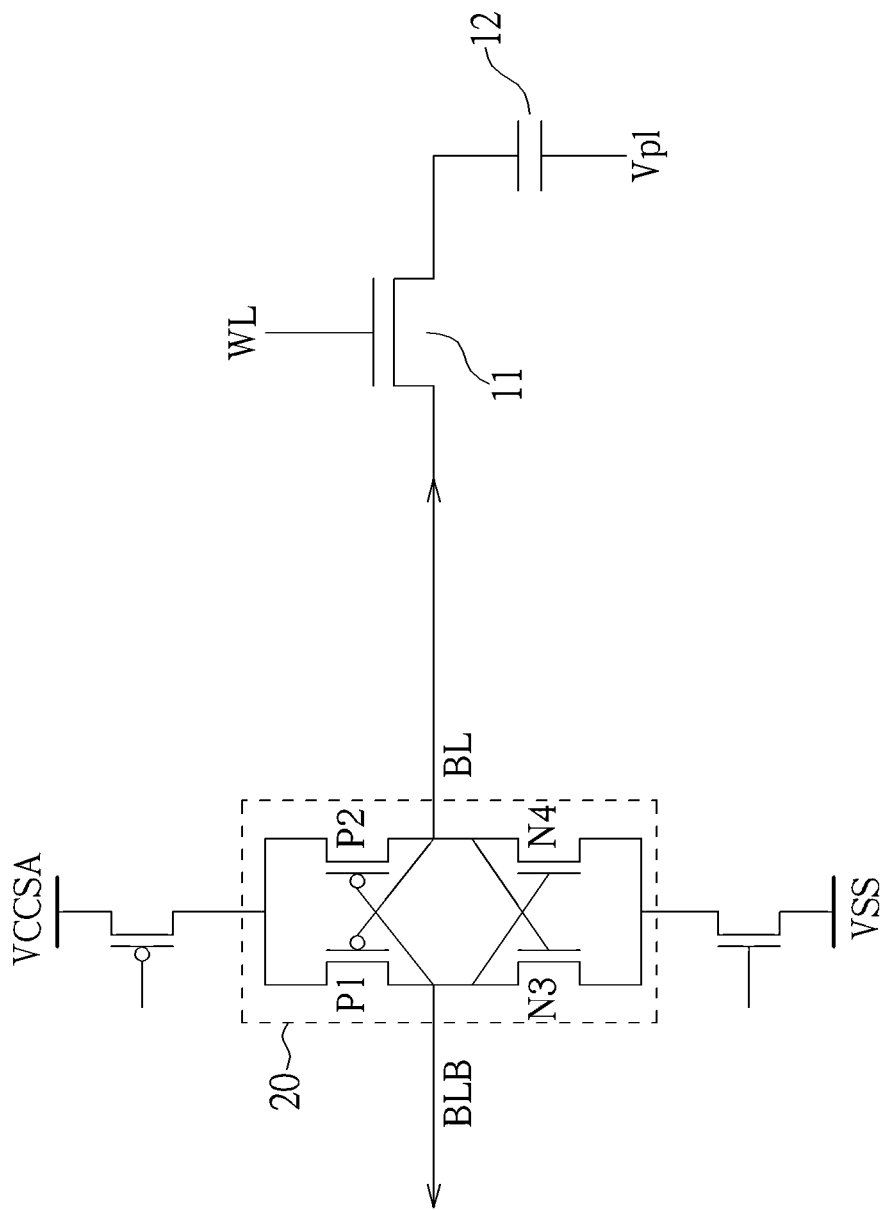
FIG. 1A illustrates commonly used design of the DRAM cell and the array sense amplifier.
Figure 1B:
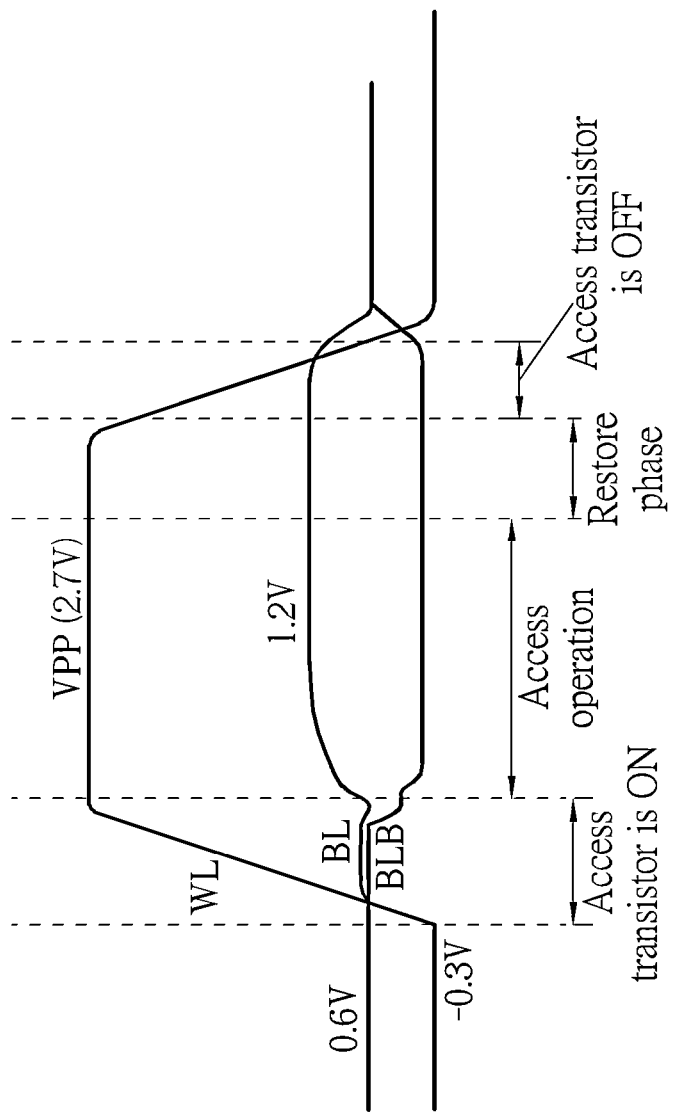
FIG. 1B illustrates the related signal waveforms during access (READ or WRITE) operation of most current DRAMs.
Figure 1C:
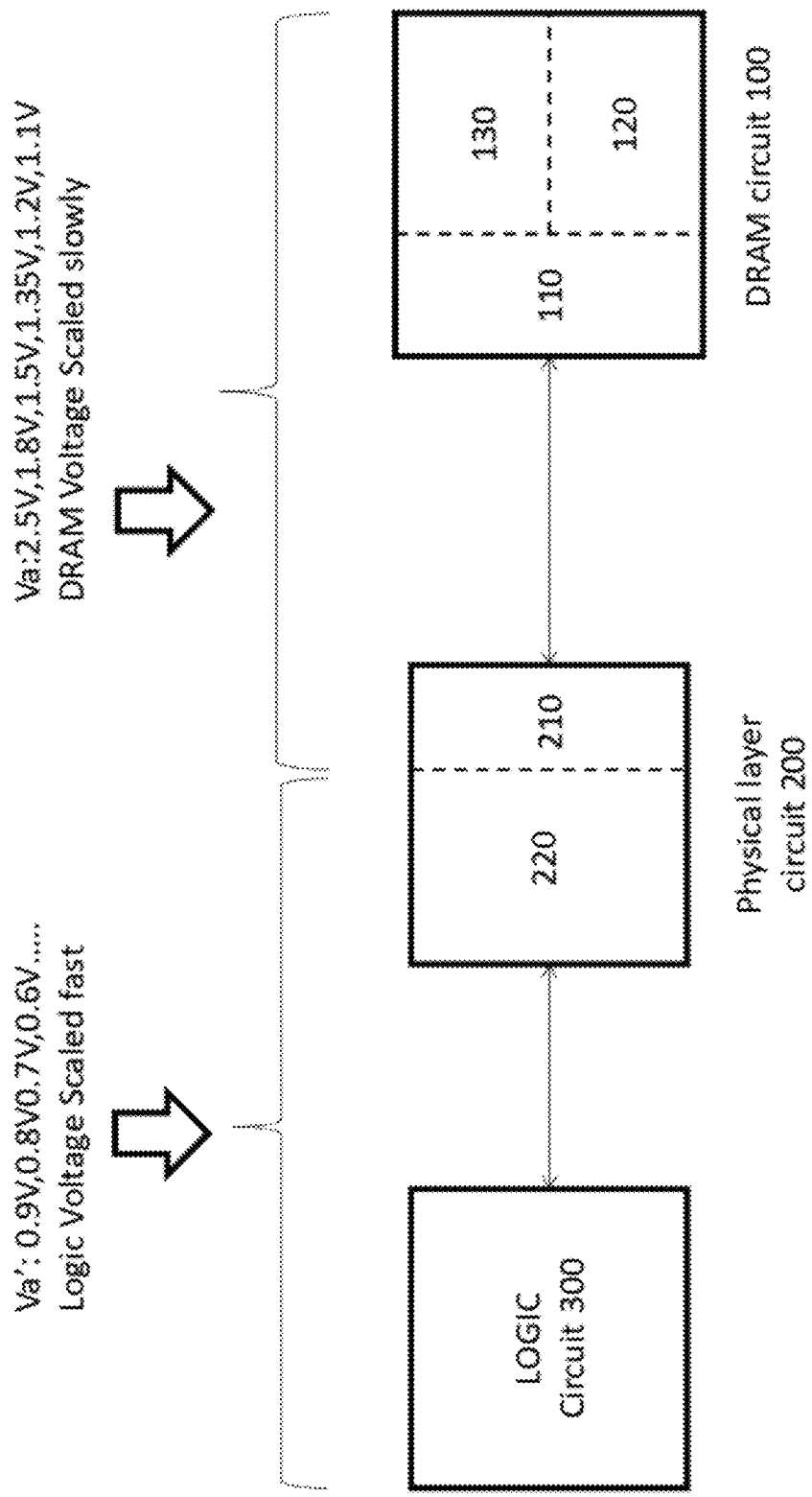
FIG. 1C illustrates function blocks for the logic circuit, the physical layer circuit and the DRAM circuit in the tradition design.
Figure 1D:
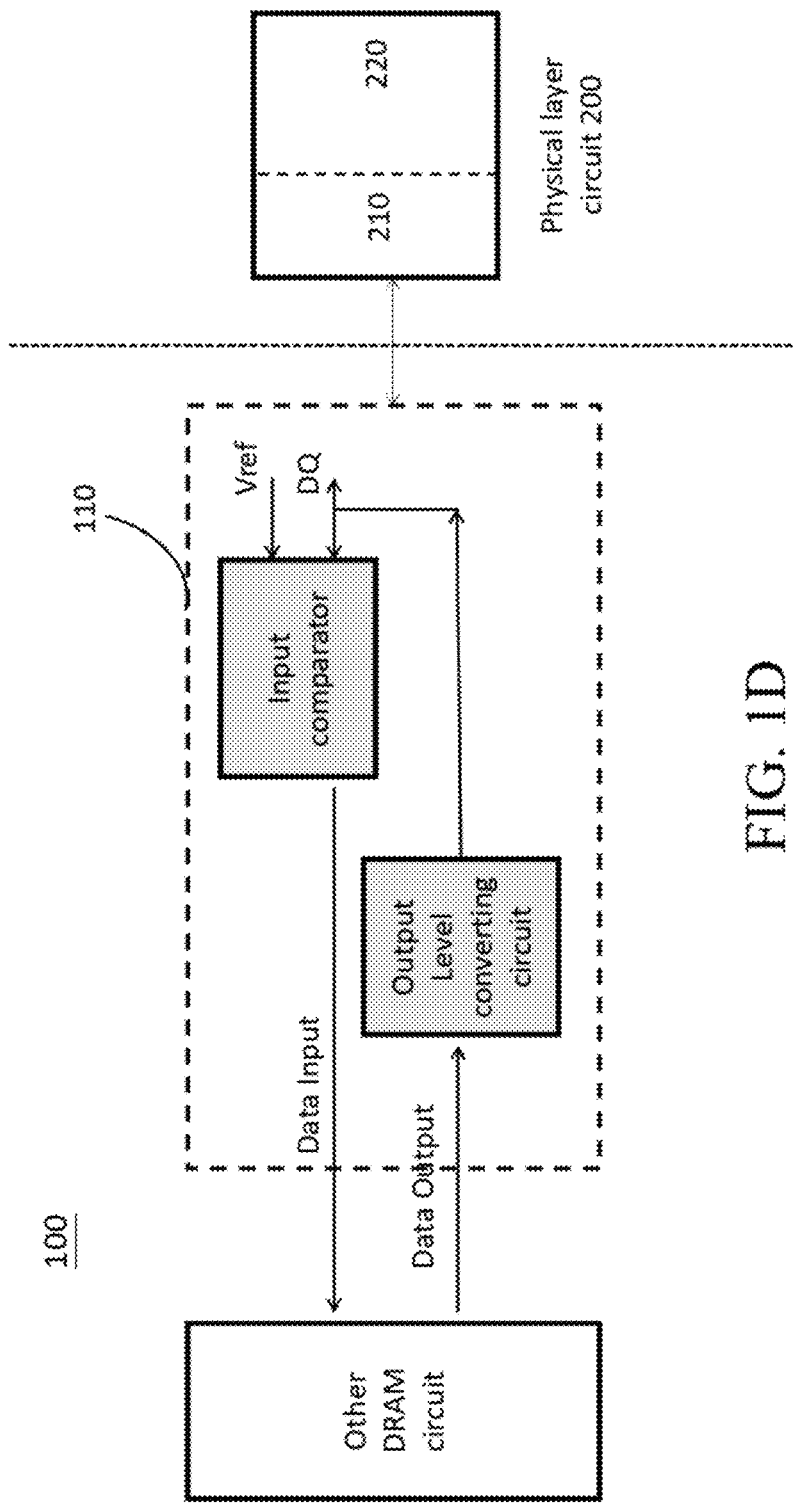
FIG. 1D illustrates portion of function blocks for the I/O circuit of the DRAM circuit in the tradition design.
Figure 1E:
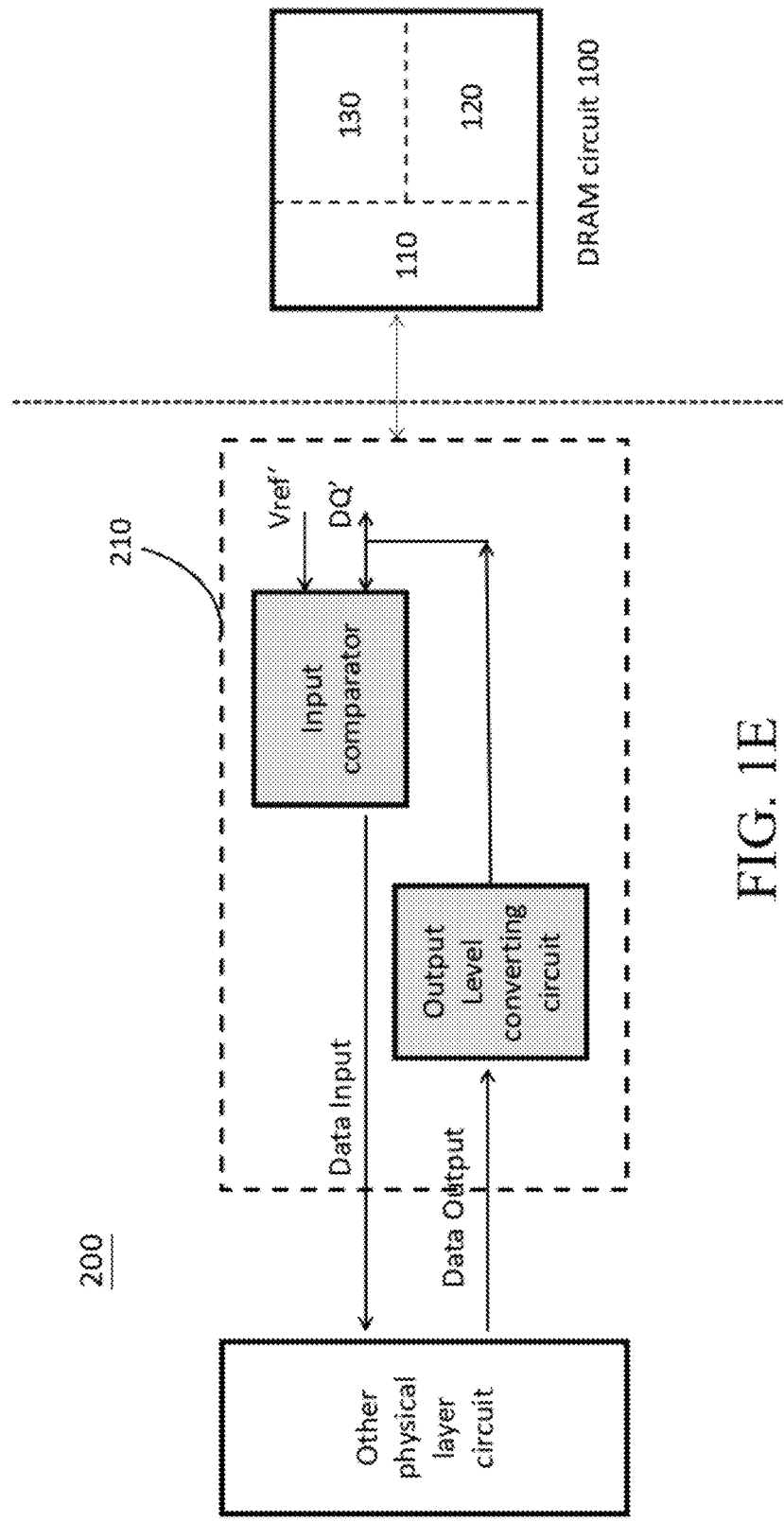
FIG. 1E illustrates portion of function blocks for the I/O physical circuit of the physical layer circuit in the tradition design.
Figure 2:
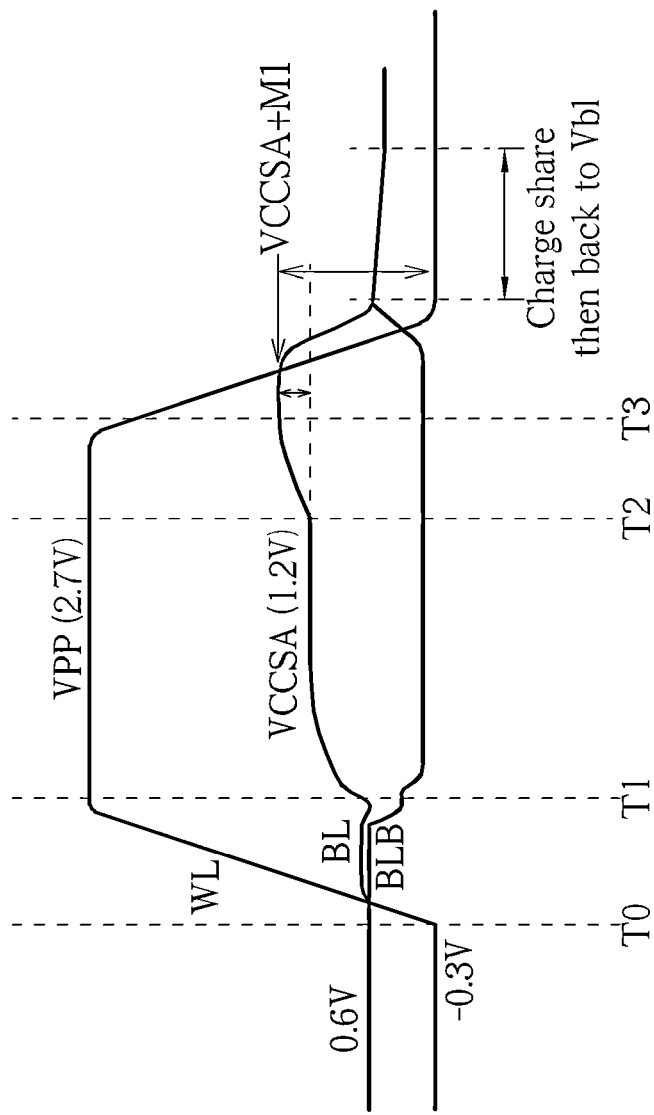
FIG. 2 illustrates the related signal waveforms during access (READ or WRITE) operation of the DRAM cell according to one embodiment of this invention.

FIG. 2 illustrates the related signal waveforms for access (READ or WRITE) operation of the DRAM cell according to one embodiment of this invention. By starting from the standby mode of the DRAM, the word-line WL is biased at −0.3 V in order to fully turn off the access transistor 11. In this embodiment, the VCCSA is set to 1.2V and VSS is set to 0V. The level of signal ONE is 1.2V and the level of signal ZERO is 0 V (GND) in this example. The bit-lines (BL and BLB) are equalized at a voltage level of 0.6V between the signal ONE level at VCCSA=1.2V and the signal ZERO level at VSS=0V.

At T0, the word-line voltage is ramping up from −0.3 V to 2.7 V which is much higher than the VCCSSA of 1.2 V and the access transistor's threshold voltage of 0.8 V to give enough driving for the turned-on access transistor 11 to transfer either the signal ONE or ZERO to the bit-lines. Until the signal is developed to a certain magnitude the sense amplifier 20 is activated to amplify the signal across the bit-line (BL) and bit-line bar (BLB). After T1, either READ operation (by amplifying the signals transferred out by the cell signals on bit-lines) or WRITE operation (these signals ONE and ZERO are written from the external to twist the sense amplifier 20 for storing the right signals to the DRAM cell) can be performed. Of course, besides READ or WRITE, other DRAM operations may be performed after T1. That is, the DRAM cell is accessible during the period between T1 and T2.

Figure 3A:
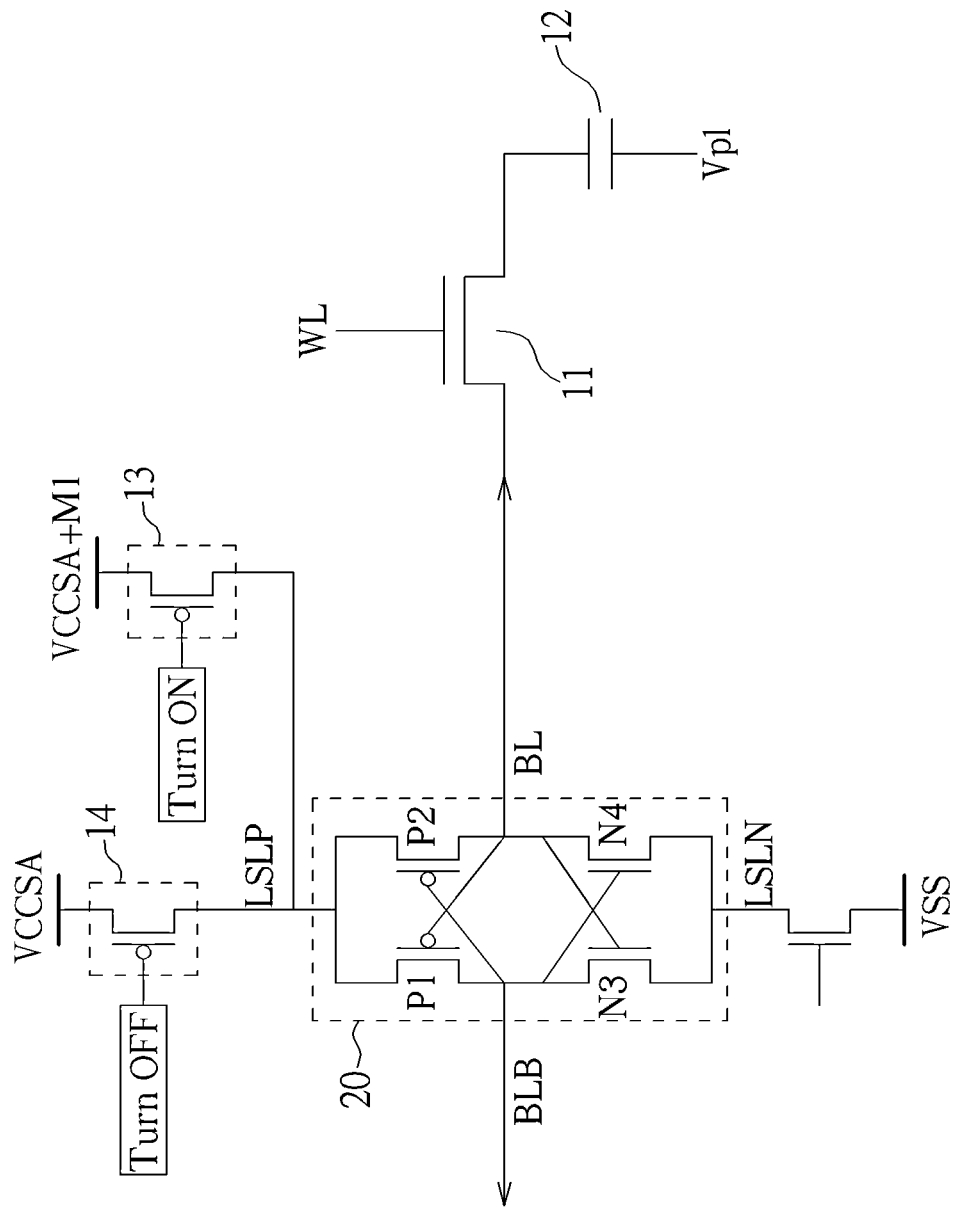
FIG. 3A shows a schematic circuit for the sense amplifier selectively coupled to a first sustaining voltage source which is higher than VCCSA.

After T2 during the RESTORE phase, the dielectric of the access transistor 11 is still loaded by VPP from word-line (WL) for a reasonably short time of restore. A first sustaining voltage source is intentionally coupled to the capacitor of the DRAM cell during this RESTORE phase. The voltage level of the first sustaining voltage source is higher than VCCSA of 1.2V (or the voltage level of signal ONE). This could be done by connecting or coupling the first sustaining voltage source (VCCSA+M1) to the sense amplifier 20 (such as, by turning on the switch 13), as shown in FIG. 3A which illustrates a schematic circuit of the sense amplifier 20 selectively coupled to the first sustaining voltage source. During this RESTORE phase, the original VCCSA voltage source is disconnected from the sense amplifier (such as, by turning off the switch 14), and the first sustaining voltage source (VCCSA+M1) will be connected to the sense amplifier 20, as shown in FIG. 3A. M1 could be a positive number such that the first sustaining voltage source (VCCSA+M1) is higher than VCCSA. In one example, M1 could be in the range of 1/3 VCCSA to 2/3 VCCSA, such as 0.6V. For example, when the signal ONE is originally in the storage capacitor, during this RESTORE phase, a voltage level of 1.2V+0.6V from the first sustaining voltage source is then supplied to the storage capacitor 12 through the sense amplifier 20. That is, before the turn off of the access transistor 11 at T3 (that is, the word-line WL is pulled down from VPP of 2.7V to the voltage of word-line at standby mode of −0.3V) in FIG. 2, the storage capacitor 12 is supplied with the voltage level of the first sustaining voltage source which is higher than that of the regular signal ONE (VCCSA). Thus, after the turn off of the access transistor 11, the storage capacitor 12 can sustain for a longer period compared with conventional DRAM structure even there is leakage current through the access transistor 11. In one embodiment, after the turn off of the access transistor 11 or after the RESTORE phase, the first sustaining voltage source (VCCSA+M1) could be disconnected from the sense amplifier 20. Additionally, the bit-line (BL) could be coupled to a bit-line voltage source with a voltage level of Vbl, such that the voltage level of the bit-line (BL) will be reset to Vbl, as shown in FIG. 2. The switches 13 and 14 shown in FIG. 3A are PMOS transistors, and for layout point of view it is required to prepare an extra N-well to accommodate the PMOS transistors. To simplify the layout, the switches 13 and 14 could be MNOS transistors such that the NMOS transistors are positioned in the p-substrate. However, it requires higher voltage to fully turn on the NMOS transistors.

Figure 3B:
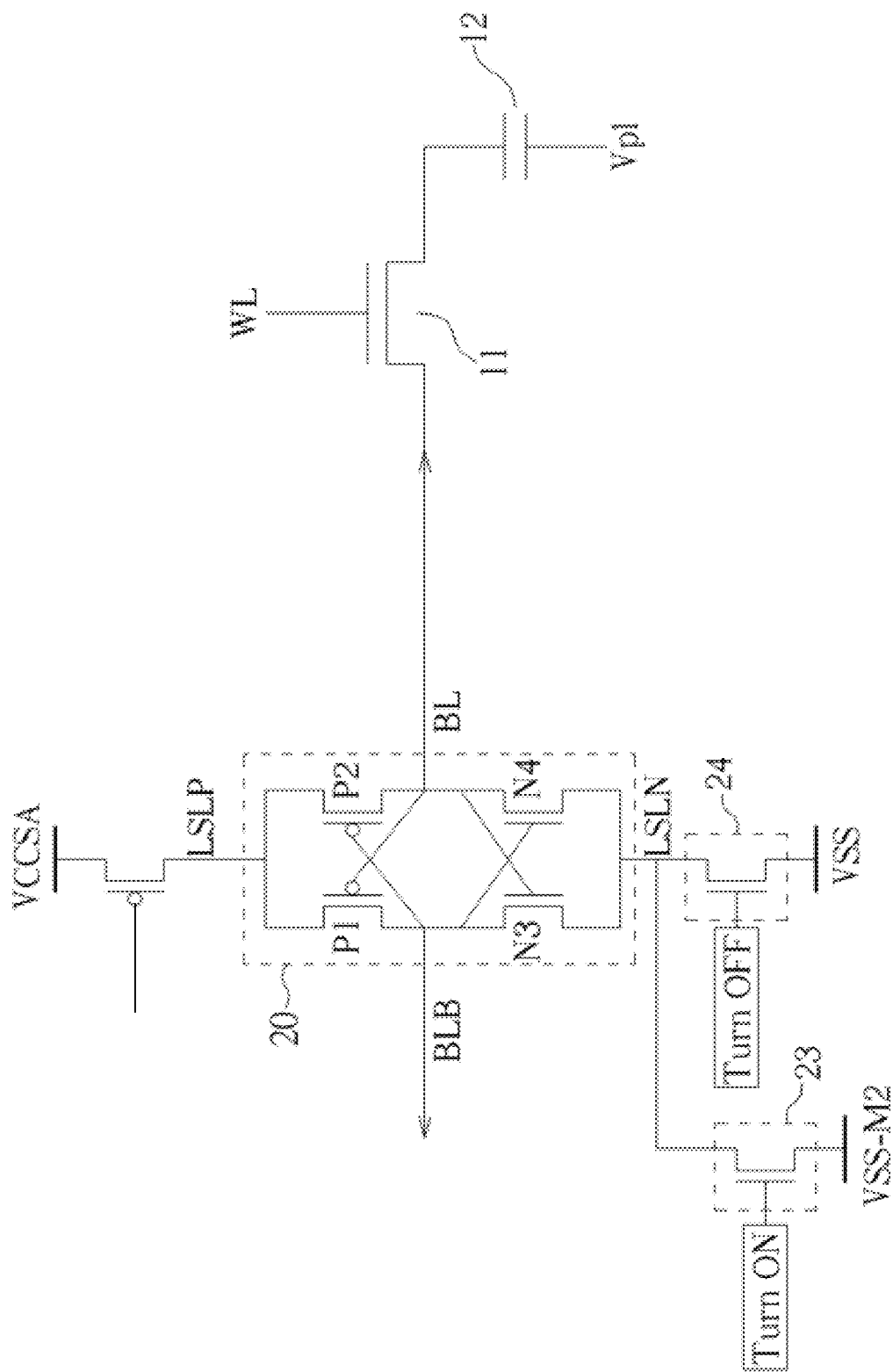
FIG. 3B shows a schematic circuit for the sense amplifier selectively coupled to a second sustaining voltage source which is lower than VSS.

In another embodiment, after T2 during the RESTORE phase, a second sustaining voltage source is intentionally coupled to the capacitor of the DRAM cell during RESTORE phase. The voltage level of the second sustaining voltage source is lower than voltage source VSS (0V or the voltage level of signal ZERO). This could be done by connecting the second sustaining voltage source (VSS-M2) to the sense amplifier (such as, by turning on the switch 23), as shown in FIG. 3B. FIG. 3B illustrates a schematic circuit of the sense amplifier selectively coupled to a second sustaining voltage source (VSS-M2) which is lower than VSS, wherein M2 could be a positive number. In one example, M2 could be in the range of 0.4V~0.8V, such as 0.6V. Of course, when the second sustaining voltage source is coupled to the sense amplifier 20 during the RESTORE phase, the voltage source VSS is disconnected from the sense amplifier 20 (such as, by turning off the switch 24). When the signal ZERO is originally in the storage capacitor 12, during this RESTORE phase, a voltage level of −0.6V is then supplied to the storage capacitor. That is, before the turn off of the access transistor 11 at T3 (that is, the word-line WL is pulled down from VPP to the voltage of word-line at standby mode) in FIG. 2, the storage capacitor 12 is supplied with the voltage level of the second sustaining voltage source which is lower than that of the regular signal ZERO (VSS). In one embodiment, after the turn off of the access transistor 11 or after the RESTORE phase, the second sustaining voltage source (VSS-M2) could be disconnected from the sense amplifier 20.

Of course, in another embodiment, both the first and second sustaining voltage sources could be intentionally coupled to the capacitor of the DRAM cell during RESTORE phase. Therefore, before the word-line WL is pulled down from VPP to the voltage of word-line at standby mode, when the signal ONE is originally in the storage capacitor, a voltage level of 1.2V+0.6V is then stored in the storage capacitor; or when the signal ZERO is originally in the storage capacitor, a voltage level of −0.6V is then stored in the storage capacitor.

In order to reduce the leakage current to maintain the stored charges without being leaked through the access transistor, usually designs are made to let the access transistor have a very high threshold voltage. When the VCCSA is reduced to 0.6 V, the 7 nm or 5 nm process tri-gate or FinFET transistors are adopted for peripheral circuits in DRAM design, and the threshold voltage of these transistor can be scaled accordingly, such as to be reduced to 0.3 V. In this embodiment, the threshold voltage of the access transistor could be raised up to 0.5 to 0.6 V on purpose. So the leakage current from the storage capacitor is sharply reduced by at least 3~4 decades (=0.6−0.3~0.3 V, if the S-factor is 68 mV/decade, the leakage can be reduced 4 decades than that of the peripheral Tri-gate devices; if the threshold voltage is raised to 0.5 V, then the leakage current should be 2~3 decades). Raising the threshold voltage close to the VCCSA or at least more than 80% of the 0.6 V is proposed. In the embodiment, the gate-dielectric thickness of the access transistor (such as finfet or tri-gate transistor) is still maintained as that of the peripheral transistors without increasing its thickness, and then the high performance merit of using the tri-gate structure can be maintained.

Figure 4:
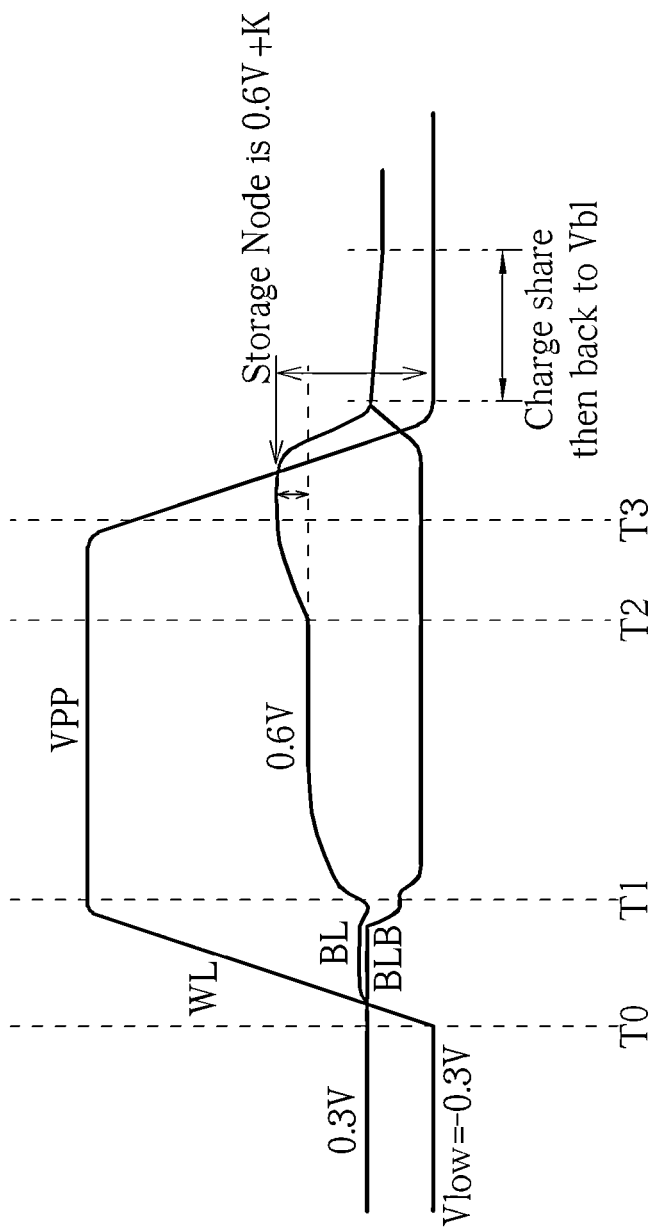
FIG. 4 illustrates the related signal waveforms of the DRAM cell according to another embodiment of this invention.

FIG. 4 illustrates the related signal waveforms of the DRAM cell according to another embodiment of this invention. The level of signal ONE is 0.6V and the level of signal ZERO is 0 V (GND) in this example. After T2 during the RESTORE phase, a first sustaining voltage source is intentionally coupled to the capacitor of the DRAM cell during RESTORE phase. The voltage level of the first sustaining voltage source is higher than VCCSA of 0.6V (or the voltage level of signal ONE). This could be done by connecting the first sustaining voltage source (VCCSA+K) to the sense amplifier, wherein K could be a positive number. In one example, K could be in the range of 1/3 VCCSA to 2/3 VCCSA, such as 0.3 V or 0.4 V. Therefore, when the signal ONE of 0.6V is originally in the storage capacitor, during this RESTORE phase, a voltage level of 0.6V+0.4V is then supplied to the storage capacitor. That is, before the turn off of the access transistor at T3 (that is, the word-line WL is pulled down from VPP to the voltage of word-line at standby mode) in FIG. 4, the storage capacitor is supplied with the voltage level of the first sustaining voltage source which is higher than that of the regular signal ONE (VCCSA of 0.6V). Therefore, after the word-line WL is pulled up to VPP but before the word-line is pulled down to the standby or inactive mode, a voltage level of 1V is then stored in the storage capacitor when the signal ONE is originally in the storage capacitor. In one embodiment, after the RESTORE phase, the bit-line (BL) and bit-line bar (BLB) could be coupled to a bit-line voltage source with a voltage level of Vbl, such that the voltage level of the bit-line (BL) and the voltage level of bit-line bar (BLB) will be reset to Vbl, as shown in FIG. 4.

Of course, as previously mentioned, before the word-line WL is pulled down from VPP to the voltage of word-line at standby mode, when the signal ZERO is originally in the storage capacitor, a voltage level of the second sustaining voltage source could be then stored in the storage capacitor, wherein the voltage level of the second sustaining voltage source is lower than the signal ZERO, such as −0.4V.

Figure 5:
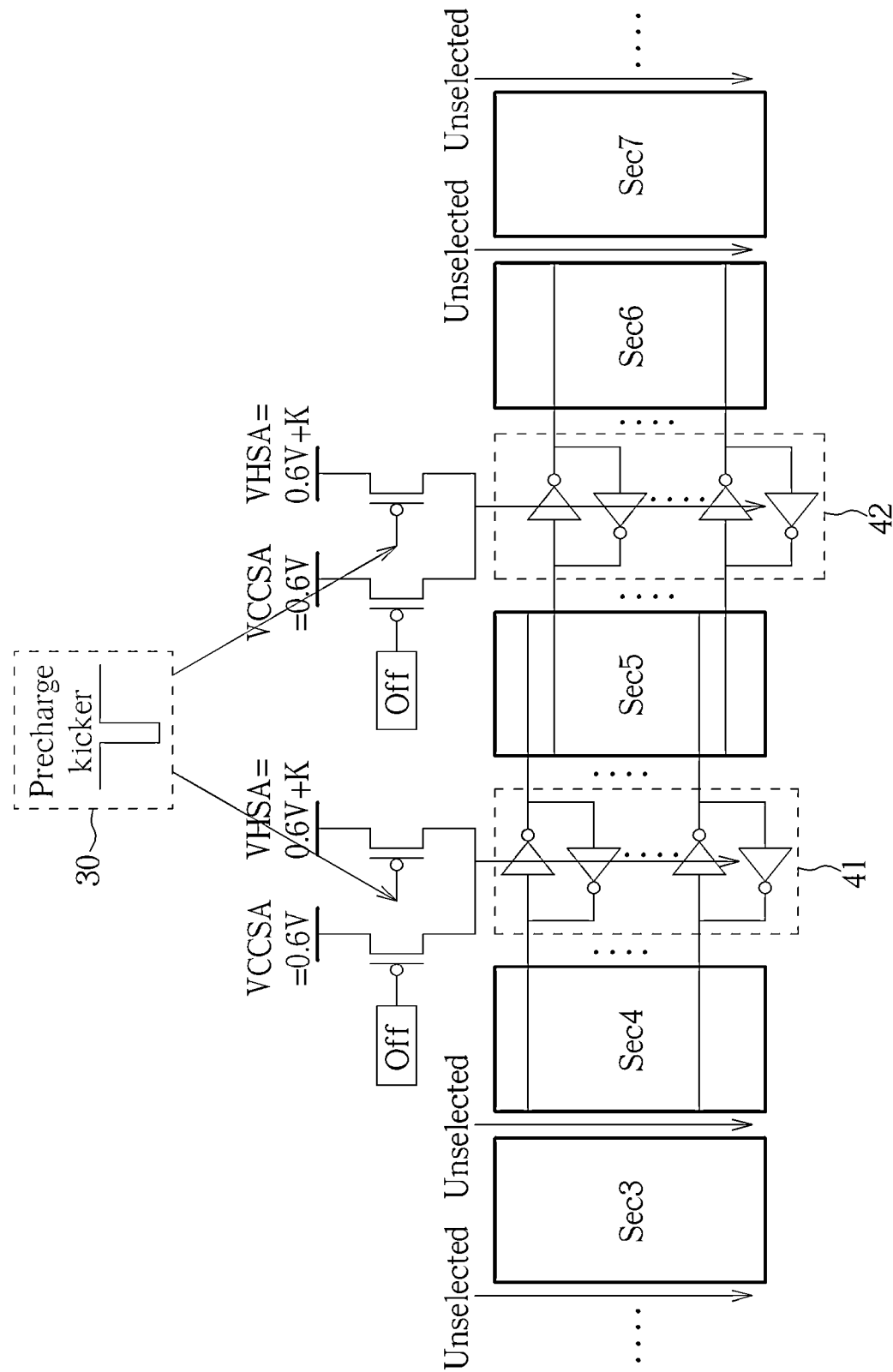
FIG. 5 shows the functional block diagrams of one embodiment of this invention regarding precharge operation.

FIG. 5 shows another embodiment regarding the circuit and functional block diagrams for precharge operation. In this embodiment, the VCCSA is set to 0.6V and VSS is set to 0V. In the precharge operation, all the DRAM cells connected to the selected word line(s) in memory section 5 ("Sec 5") will be precharged, and those DRAM cells connected to unselected word lines in other memory sections (such as "Sec4", "Sec6", etc.) will be at idle state.

The sense amplifiers 41 and 42 coupled to the DRAM cells which are connected to the selected word line(s) will be kicked to a third sustaining voltage source VHSA (0.6V+K) by the precharge kicker 30, so that a stronger drain-to-source electrical field can accelerate the signal restored to the cell. The third sustaining voltage source VHSA is higher than the VCCSA (0.6V) about few hundred mV, for example 0.3V or 0.4V. Moreover, before the selected word line(s) is OFF (that is, the access transistors of DRAM cells coupled to the selected word line(s) are OFF), the voltage level of 0.6V+ 0.4V which is higher than that of the original signal ONE could be then stored in the storage capacitors. On the other hand, the sense amplifiers coupled to the DRAM cells which are connected to the unselected word line(s) will not be kicked up and are still coupled to VCCSA.

Figure 6:
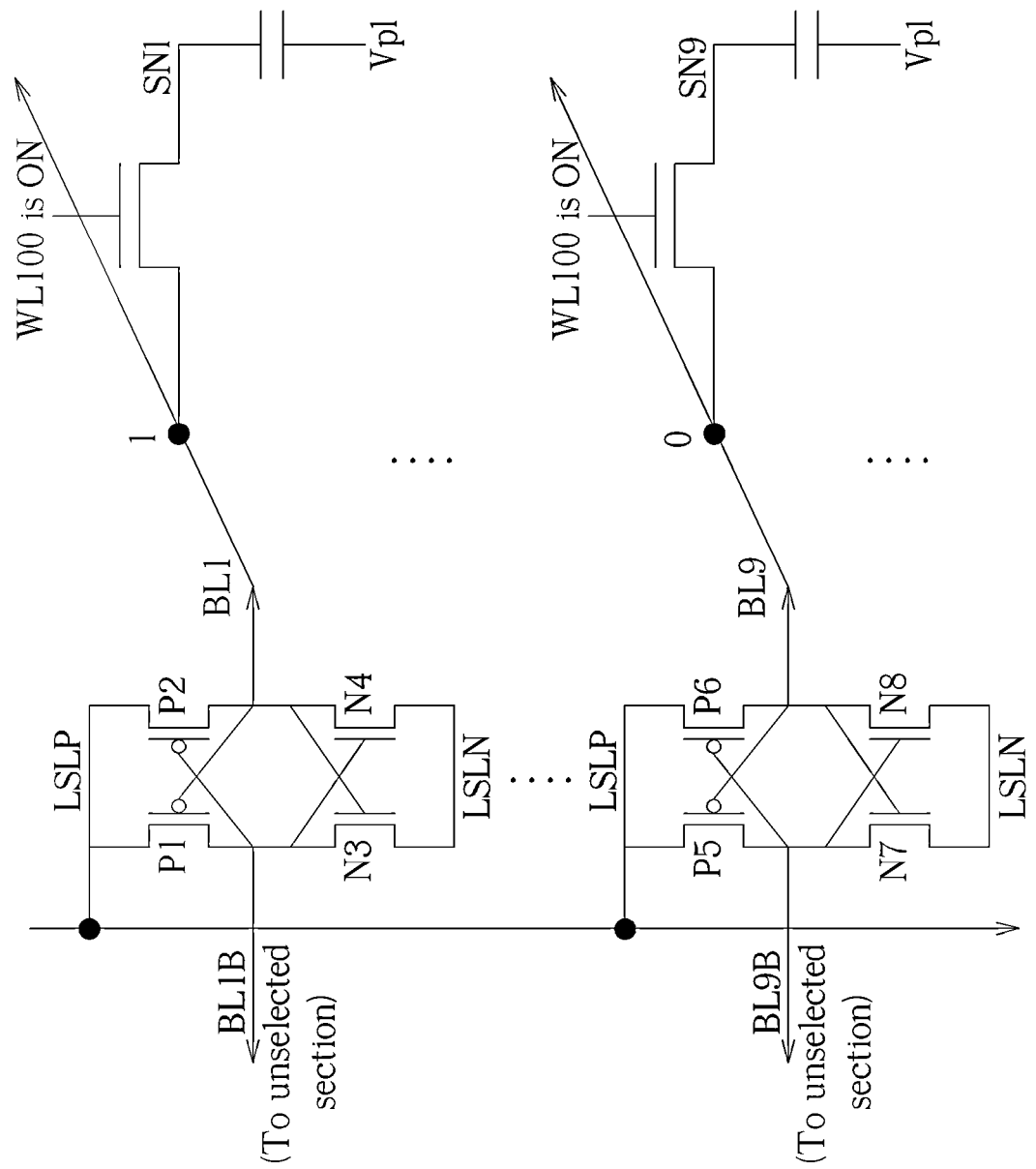
FIG. 6 illustrates the operation of the sense amplifiers for the precharge operation according to this invention.

FIG. 6 explains the operation of the sense amplifiers for the precharge phase, and the meaning for the symbols used in FIG. 6 is as follows:
VCCSA: Bit Line Sense Amplifiers Voltage
VHSA: the third sustaining voltage source
LSLP: Selected Bit Line Sense Amplifiers High Voltage
LSLN: Selected Bit Line Sense Amplifiers Low Voltage
Vpl: Plate Voltage
SN: Storage Node
WL: Word Line
BL: Bit Line
Vsg1, 2: Source to Gate Voltage of P1, P2
Vgs3, 4: Gate to Source Voltage of N3, N4
Vsg5, 6: Source to Gate Voltage of P5, P6
Vgs7, 8: Gate to Source Voltage of N7, N8

Referring to FIG. 6, the word-line WL100 is coupled to multiple storage nodes, such as SN1 and SN9. When the signal ONE (0.6V) is stored in the storage node SN1 which is connected to word-line WL100, after the precharge command is issued and the word-line WL100 is selected (that is, the word-line is ON), the LSLP of the sense amplifier is coupled to the VHSA (1.0V), therefore LSLP is kicked from 0.6V to 1.0V, and LSLN stays in 0V. Thus, transistor P1 of the sense amplifier is OFF and Vsg1=0V. Also, transistor P2 of the sense amplifier is ON and Vsg2 is kicked from 0.6V to 1.0V, and 1.0V is fully charged through bit-line BL1 to storage node SN1. Meanwhile, transistor N3 of the sense amplifier is ON and the Vgs3 is also kicked from 0.6V to 1.0V. Furthermore, transistor N4 of the sense amplifier is OFF and the Vgs4 is 0V.

When the signal ZERO (0V) is stored in the storage node SN9 which is connected to the word-line WL100, after the precharge command is issued and the word-line WL100 is selected, the sense amplifier is coupled to the VHSA (1.0V), therefore LSLP is kicked from 0.6V to 1.0V, and LSLN stays in 0V. Thus, transistor P5 of the sense amplifier is ON and Vsg5 is kicked from 0.6V to 1.0V. Also, transistor P6 of the sense amplifier is OFF and Vsg2 is 0V. Meanwhile, transistor N7 of the sense amplifier is OFF and the Vgs7 is 0V. Furthermore, transistor N8 of the sense amplifier is ON and the Vgs8 is kicked from 0.6V to 1.0V, and 0V is restored strongly through bit-line BL9 to storage node SN9. Of course, as previously mentioned, when the signal ZERO is originally in the storage capacitor, LSLN could be coupled to another sustaining voltage source VLSN (0V-K) during the precharge phase. VLSN is lower than the voltage level of the signal ZERO, and in this case, VLSN could be −0.4V.

Then −0.4V is restored strongly through bit-line BL9 to storage node SN9 during the precharge phase.

Figure 7:
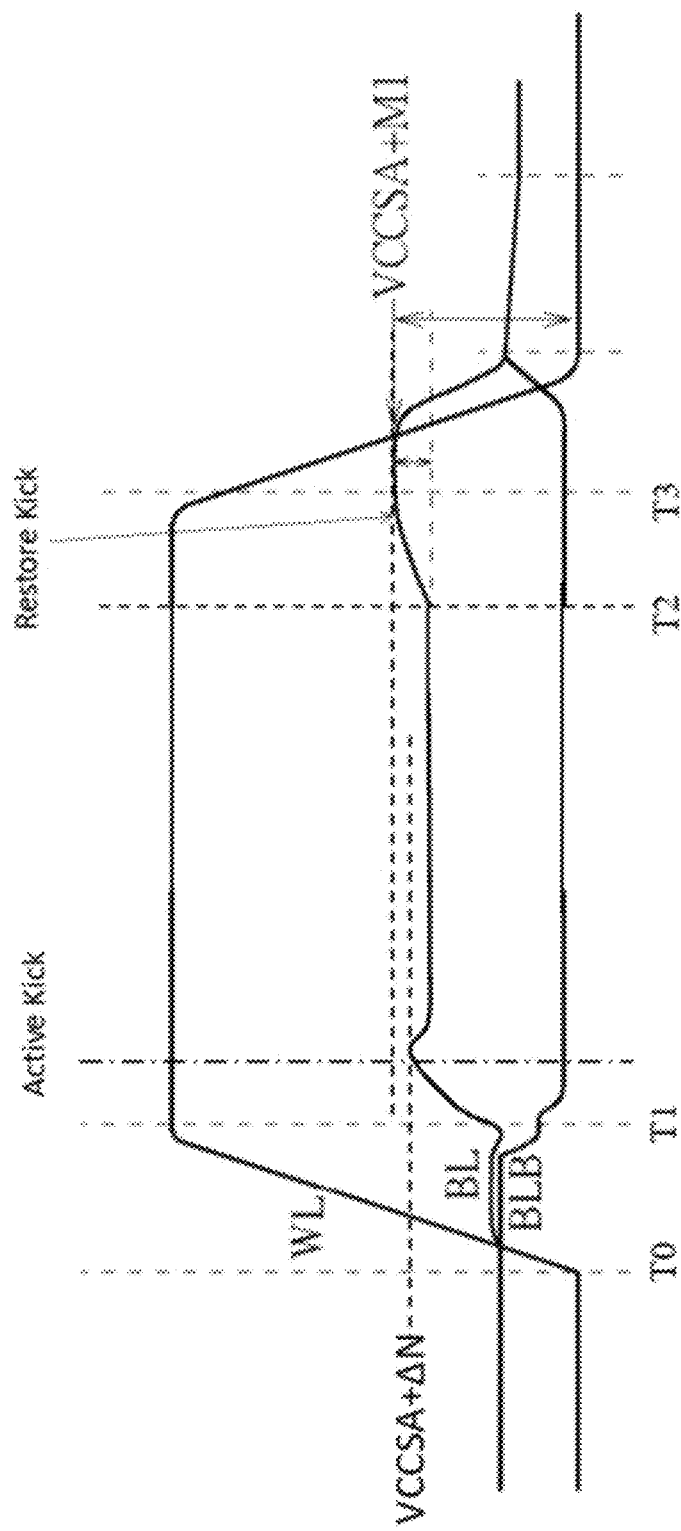
FIG. 7 illustrates the related signal waveforms during the operation of the DRAM cell according to another embodiment of this invention.

In another embodiment, as shown in FIG. 7, after T0, the word-line voltage is ramping up in order to turn on the access transistor of the DRAM cell. Then in regular READ or WRITE access for DRAM, there is an active command to be performed. A corresponding voltage which is a little bit higher than VCCSA (such as VCCSA+AN) could be connected to the sense amplifier (by turning off the switch 14 and turning on the switch 13 as shown in FIG. 3A) during the performance of the active command to reduce tRCD defined by JEDEC. Such voltage level or voltage source is coupled to the bit line during the period between T1 and T2 (that is, the access operation period). Thus, the corresponding voltage (VCCSA+AN) could be connected to the sense amplifier according to active command. Therefore, the signal of the bit-line would be pumped (or kicked) at least to VCCSA+AN during the performance of the active command. Such pump or kick in bit-line signal could be named as active kick. Such active kick for the bit-line would expedite the signal sensing. After the performance of the active command or active kick, a regular voltage source VCCSA is connected to the sense amplifier and then the signal of the bit-line would be back to VCCSA during the following READ or WRITE operation. Similarly, after T2 during the RESTORE (or precharge) phase, the first sustaining voltage source VCCSA+M1 (or a different sustaining voltage which is higher than VCCSA) is again coupled to the capacitor of the DRAM cell during this RESTORE phase. That is, during this RESTORE (or precharge) phase, the original VCCSA voltage source is disconnected from the sense amplifier (such as, by turning off the switch 14 as shown in FIG. 3A), and the first sustaining voltage source VCCSA+M1 will be connected to the sense amplifier 20 (such as, by turning on the switch 13 as shown in FIG. 3A). The signal of the bit-line would be pumped (or kicked) at least to VCCSA+M1. Such pump or kick in bit-line signal could be named as restore kick. Thus, before the word-line WL is pulled down to fully turn off the access transistor of the DRAM cell, the storage capacitor of the DRAM cell is supplied with the voltage level of the first sustaining voltage source which is higher than that of the regular signal ONE (VCCSA), and the storage capacitor of the DRAM cell can sustain for a longer period compared with conventional DRAM structure even there is leakage current through the access transistor.

In one embodiment, the corresponding voltage (VCCSA+AN) used in active kick is lower than the first sustaining voltage (VCCSA+M1) used in restore kick. In another embodiment, the corresponding voltage (VCCSA+AN) used in active kick is the same or substantially the same as the first sustaining voltage (VCCSA+M1) used in restore kick. The corresponding voltage (VCCSA+AN) and the first sustaining voltage (VCCSA+M1) could be generated from two different voltage sources respectively. Alternatively, the corresponding voltage (VCCSA+AN) used in active kick to kick the voltage of bit line may be generated from the first sustaining voltage source (VCCSA+M1), but the duration for connecting the first sustaining voltage source (VCCSA+M1) to the bit line is adjusted such that the bit line is just pumped or kicked to the corresponding voltage (VCCSA+AN), rather than (VCCSA+M1). Of course, in the present invention, the voltage (VCCSA+M1), the voltage (VCCSA+AN), and the voltage (VCCSA) could be generated or converted internally in the DRAM, or could be supplied or converted from other voltage sources external to the DRAM chip. Furthermore, to raise the bit line up to the voltage level VCCSA+AN or VCCSA+M1 during the active kick could be done by a boostrap circuit in which charges of a capacitor in the boostrap circuit is coupled to the bit line. No matter the voltage source or the boostrap circuit, it could be deemed as a charge source, thus, the bit line could be kicked or pumped to the voltage level VCCSA+AN or VCCSA+M1 by a charge source during the active kick.

Figure 8A:
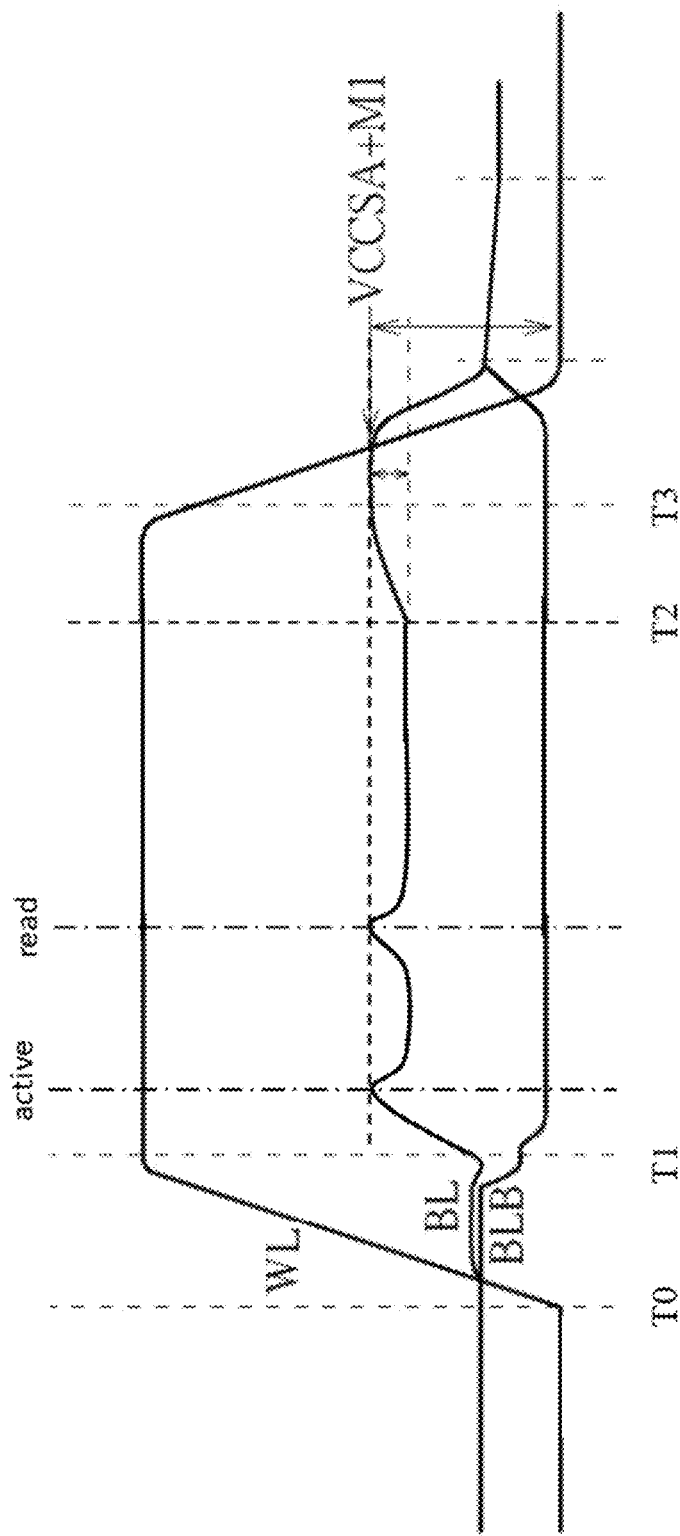
FIG. 8A illustrates the related signal waveforms during the operation of the DRAM cell with three kicks according to another embodiment of this invention.

FIG. 8A illustrates the related signal waveforms for the operation of the DRAM cell according to another embodiment of this invention. During the period between T1 and T2, there is an active command to be performed and a corresponding first sustaining voltage source (VCCSA+M1) could be connected to the sense amplifier during the active operation. Therefore, the signal of the bit-line would be pumped (or kicked) at least to VCCSA+M1 during the active command. After the performance of the active command, a regular voltage source VCCSA is connected to the sense amplifier and then the signal of the bit-line would be back to VCCSA. After the active command, one (or more) read command could be performed before T2, and the first sustaining voltage source (VCCSA+M1) could be connected to the sense amplifier again during the read command such that the signal of the bit-line would be pumped (or kicked) at least to VCCSA+M1 during the read command. After the performance of the read command, a regular voltage source VCCSA is connected to the sense amplifier again (by turning off the switch 13 and turn on the switch 14, as shown in FIG. 3A) and then the signal of the bit-line would be back to VCCSA. Such kick for the bit-line during the read command would improve the signal development time. For example, in the event VCCSA is 1.1V and M1 is 0.2V, the signal development time with the kick during the read command is faster around 20%~30% than that without the kick.

Figure 8B:
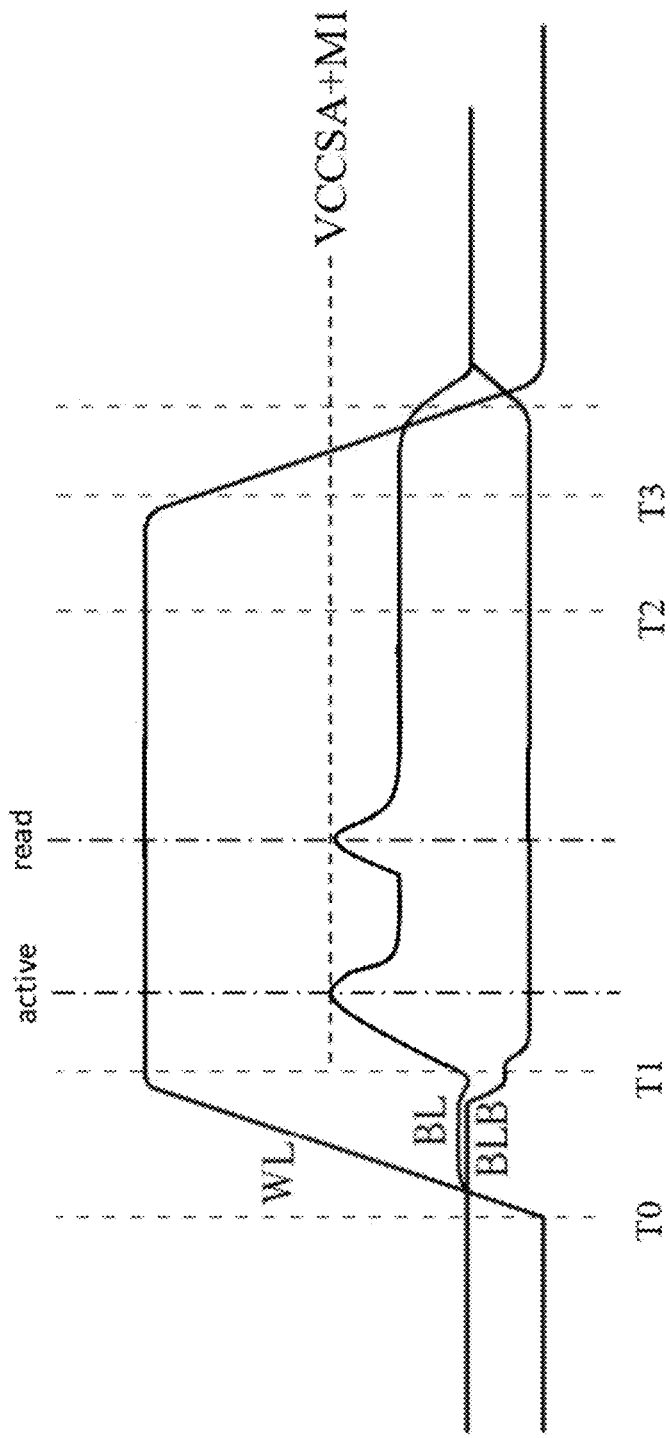
FIG. 8B illustrates the related signal waveforms during the operation of the DRAM cell with two kicks according to another embodiment of this invention.

Similarly, after T2 during the RESTORE phase, the original VCCSA voltage source is disconnected from the sense amplifier, the first sustaining voltage source VCCSA+M1 will be connected to the sense amplifier 20, and the signal of the bit-line would be pumped (or kicked) at least to VCCSA+M1. Thus, the storage capacitor of the DRAM cell is supplied with the voltage level of the first sustaining voltage source which is higher than that of the regular signal ONE (VCCSA). In another embodiment, however, after T2 during the RESTORE phase, the original VCCSA voltage source (rather than VCCSA+M1) is still connected to the sense amplifier, as shown in FIG. 8B.

Figure 8C:
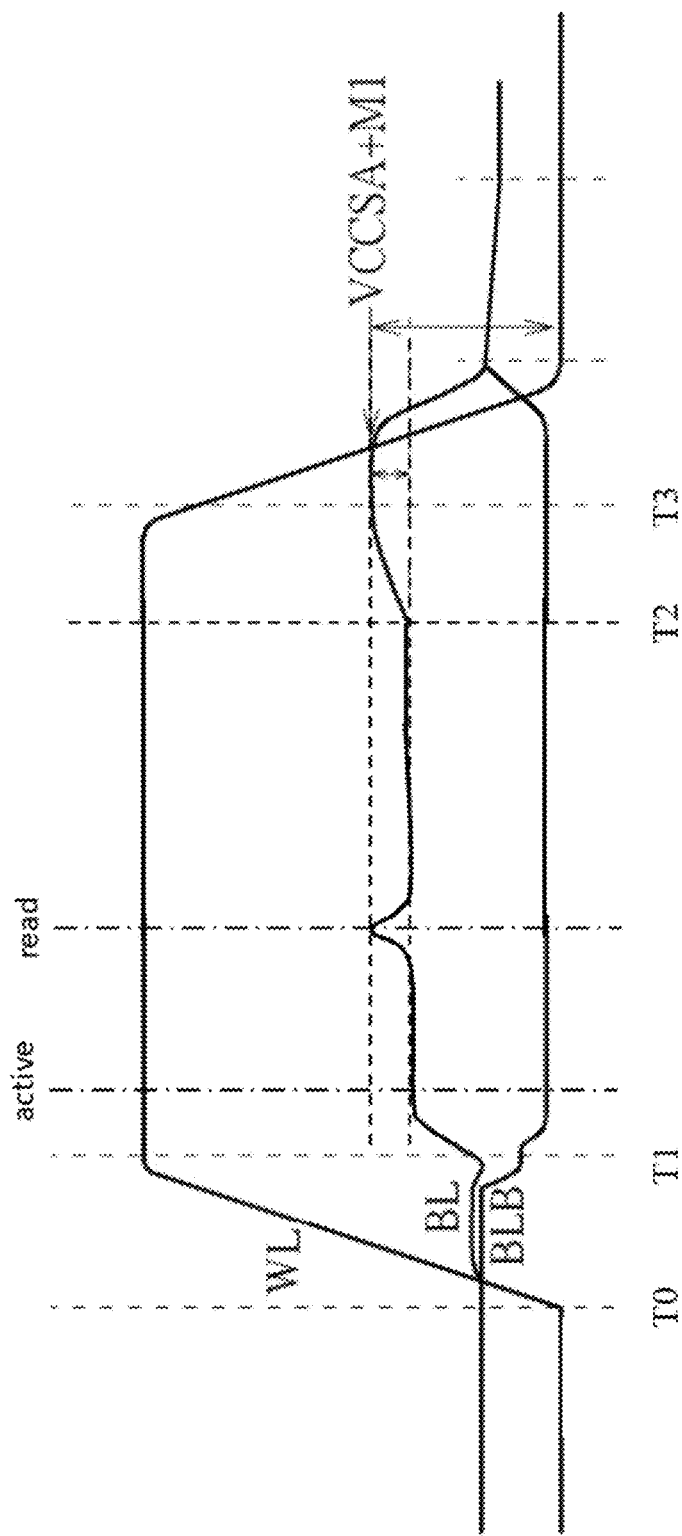
FIG. 8C illustrates the related signal waveforms during the operation of the DRAM cell with another two kicks according to another embodiment of this invention.

Moreover, in other embodiment, the signal of the bit-line is not kicked to VCCSA+M1 during the active command, but the signal of the bit-line is kicked to VCCSA+M1 during the read command. After T2 during the RESTORE phase, the first sustaining voltage source VCCSA+M1 will be connected to the sense amplifier such that the signal of the bit-line would be pumped (or kicked) at least to VCCSA+M1, as shown in FIG. 8C.

Figure 8D:
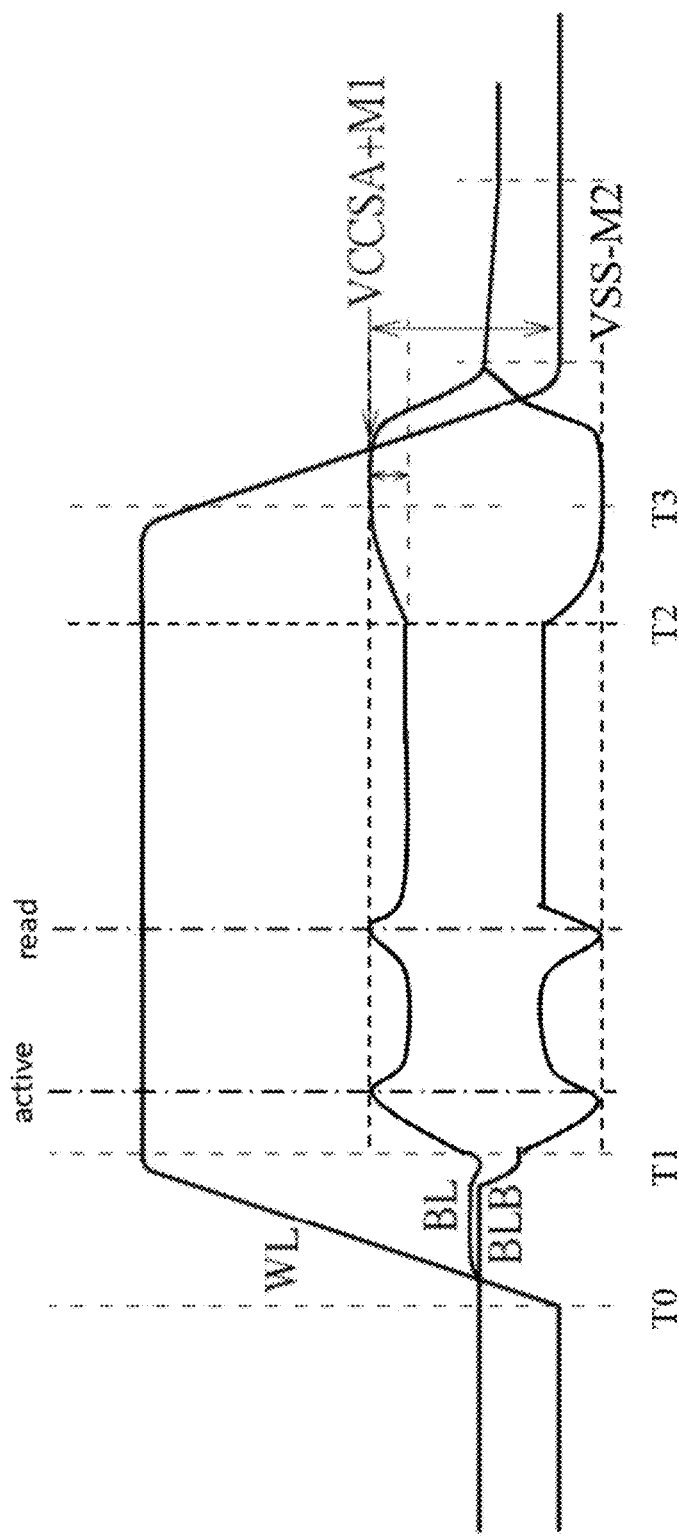
FIG. 8D illustrates the related signal waveforms during the operation of the DRAM cell with another three kicks according to another embodiment of this invention.

FIG. 8D illustrates the related signal waveforms for the operation of the DRAM cell according to another embodiment of this invention. Similar to FIG. 8A, during the period between T1 and T2, there are an active command and at least a read command following the active command to be performed, and a corresponding first sustaining voltage source (VCCSA+M1) could be connected to the sense amplifier (by turning on the switch 13 as shown in FIG. 3A) during the active operation and during the read command. Furthermore, a corresponding second sustaining voltage source (VSS-M2) could be connected to the sense amplifier (by turning on the switch 23 as shown in FIG. 4A) during the active operation and during the read command. Therefore, the signal of the bit-line (BL) would be pumped (or kicked) at least to VCCSA+M1 and the signal of the bit-line bar (BLB) would be pumped (or kicked) at least to VSS-M2 during the active command and during the read command. After the performance of the active command and the read command, a regular voltage source VCCSA is connected to the sense amplifier (by turning off the switch 13 and turn on the switch 14, as shown in FIG. 3A) and a regular voltage source VSS is also connected to the sense amplifier (by turning off the switch 23 and turn on the switch 24, as shown in FIG. 3B), then the signal of the bit-line would be back to VCCSA and the signal of the bit-line bar would be back to VSS.

Similarly, after T2 during the RESTORE phase, the original VCCSA and VSS voltage sources are disconnected from the sense amplifier (such as, by turning off the switch 14 and switch 24 in FIG. 3A and FIG. 3B respectively), the first sustaining voltage source VCCSA+M1 will be connected to the sense amplifier 20 (by turning on the switch 13 in FIG. 3A) and the second sustaining voltage source VSS-M2 will be connected to the sense amplifier 20 (by turning on the switch 23 in FIG. 3B), and the signal of the bit-line would be pumped (or kicked) at least to VCCSA+M1 and the signal of the bit-line bar would be pumped (or kicked) at least to VSS-M2.

Figure 8E:
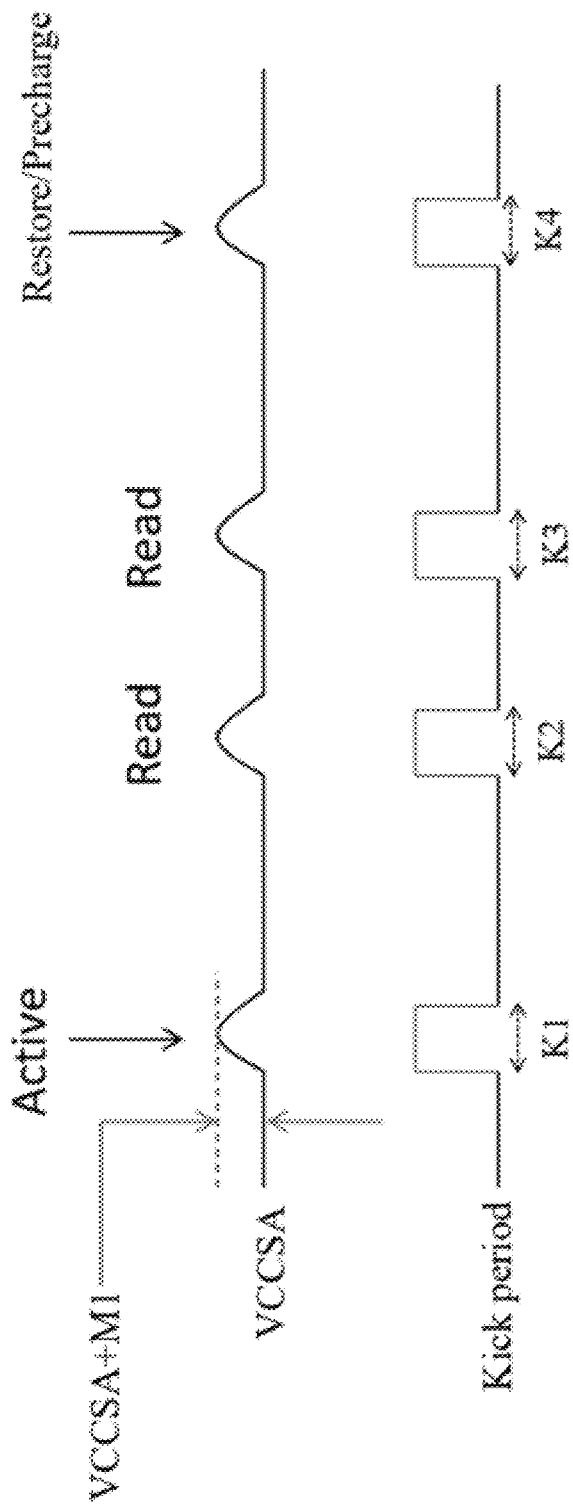
FIG. 8E illustrates the relation between the kick period and the signal of the bit-line during the operation of the DRAM cell according to one embodiment of this invention.

FIG. 8E illustrates the relation between the kick period and the signal of the bit-line during the operation of the DRAM cell. The kick period for the signal of the bit-line corresponding to the RESTORE phase (or precharge) K4 could be longer than that corresponding to the active command K1, or longer than that corresponding to the read command K2 or K3. Furthermore, the kick period for the signal of the bitline corresponding to the active command K1 would be equal to that corresponding to the read command K2 or K3. Of course, during the K1~K3 period, to raise the signal of the bit line up to the voltage level VCCSA+M1 or other the voltage level (such as VCCSA+AN, wherein AN<M1) could be done by a boostrap circuit in which charges of a capacitor in the boostrap circuit is coupled to the bit line. No matter the voltage source or the boostrap circuit, it could be deemed as a charge source, thus, the signal of the bit line could be kicked or pumped to the voltage level VCCSA+M1 or VCCSA+AN by a charge source. So is the signal of the bit line kicked to VSS-M2 (or VSS-AN, wherein AN<M2).

Of course, in another embodiment, VCCSA could be in the range of 0.9V~0.5V (such as 0.9V, 0.8V 0.7V or 0.6 V) or lower, and the kick voltage VCCSA+M1 could still be in the range of 1.1V~2.5V (such as, 1.1V, 1.2V, 1.35V, 1.5V, 1.8V, or 2.5V etc.) to overcome the leakage problem and maintain the acceptable retention time in the DRAM cell. Therefore, since leakage problem in the DRAM circuit is relieved according to the present invention, the principle power supply voltage to DRAM chip could be reduced down to 1.0V~0.5V or lower, even the exist of the slowed-down DRAM technology migration. Thus, the principle power supply voltage to DRAM chip would be the same or substantially the same as the principle power supply voltage to logic circuit chip.

Figure 9A:
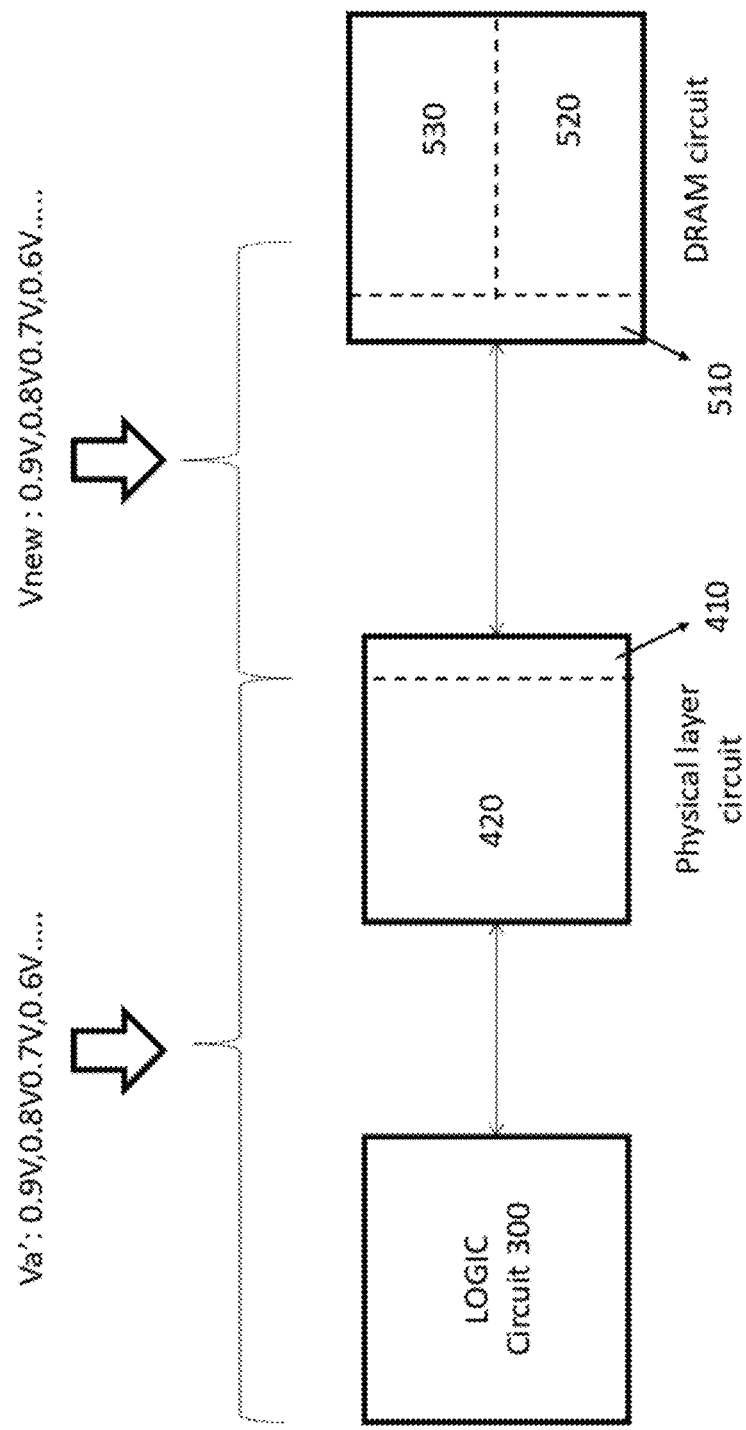
FIG. 9A illustrates function blocks for the logic circuit, the physical layer circuit and the DRAM circuit according to the present invention.

As shown in FIG. 9A, the DRAM circuit 500 includes a I/O circuit 510, a peripheral circuit 520, and a DRAM core circuit 530. A physical layer circuit (or PHY layer) 400 is between the DRAM 500 and the logic circuit 300. The physical layer circuit 400 further includes a I/O physical circuit 410 and a logic physical circuit 420. Usually, the DRAM circuit 500 would be in a DRAM chip, the physical layer circuit 400 and the logic circuit 300 would be positioned in another chip (such as a logic chip) separate from the DRAM chip. For example, the logic chip includes a memory controller which is the logic circuit 300 and also includes the physical layer circuit (or PHY circuit) 400 interacting with DRAM chip and the memory controller.

In another embodiment, the physical layer circuit 400 and the logic circuit 300 could be positioned in two separate chips, respectively. For example, the DRAM circuit 500 may include multiple DRAM chips stacked together. The stacked DRAM chips are then positioned on a based chip (or interposer) which includes the physical layer circuit (or PHY layer) 400. The logic circuit 300 are digital circuits or the memory controller positioned in another logic chip separate from the based chip.

According to the present invention, the principle power supply voltage Vnew to DRAM circuit 500 could be in the range of 1.0V~0.5V (or 0.9V~0.5V) or lower, just the same as the principle power supply voltage Va' to the logic chip or circuit 300 which already has been in the range of 1.0V~0.5V (or 0.9V~0.5V) or lower due to the fast scaled-down logic technology migration. The principle power supply voltage Vnew is external to DRAM circuit 500 and could be used by the DRAM circuit 500 to produce various voltage sources used in the peripheral circuit 520 or DRAM core circuit 530, such as the previously mentioned voltage sources VCCSA, VCCSA+M1, 1/2VCCSA, VPP, etc. The level of the VCCSA could be the same as or different from that of the principle power supply voltage Vnew to DRAM circuit. Moreover, there could be another supply voltage Vhigh external to the DRAM circuit 100, and the another supply voltage Vhigh is higher than the principle power supply voltage Vnew, and could be used to generate voltage source Vpp or VCCSA+M1 for conversion efficiency purpose.

Figure 9B:
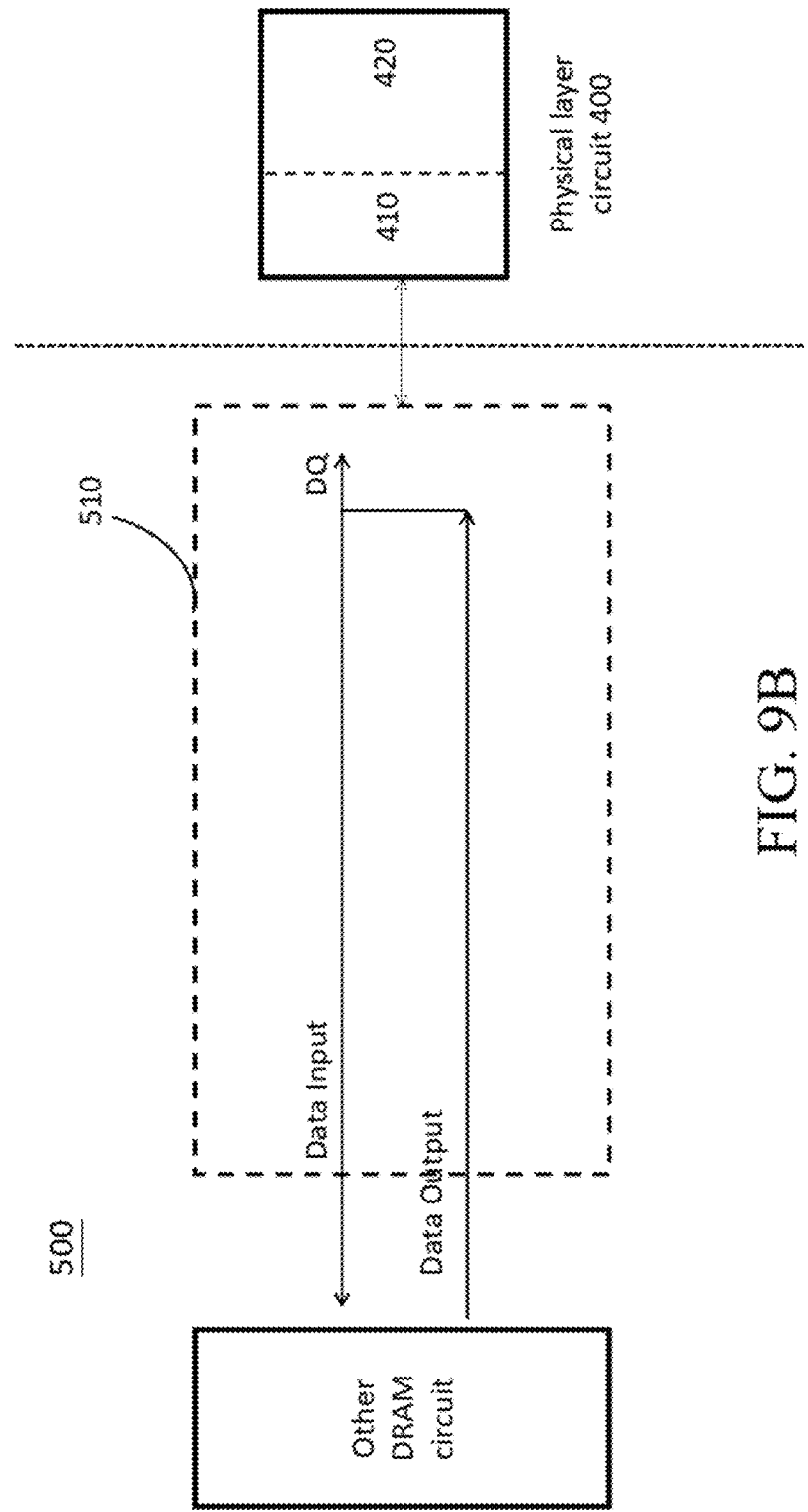
FIG. 9B illustrates portions of function blocks for the I/O circuit of the DRAM circuit according to the present invention.

Moreover, since the value of the principle power supply voltage Vnew to DRAM circuit 500 is the same or substantially the same as the value of the principle power supply voltage Va' to the logic circuit 300, the output level converting circuit (level up or level down the voltage level of the output signal) and the input comparator in the I/O circuit 110 of the traditional DRAM circuit 100 could be removed or skipped. Thus, according to the present invention as shown in FIG. 9B, the I/O circuit 510 of the DRAM circuit 500 does not include the previously mentioned output level converting circuit and the input comparator, the signal of input/output data to or from other DRAM circuit (such as peripheral circuit 520) is not necessarily converted or compared by the I/O circuit 510. Furthermore, the signal swing of input/output data to or from other DRAM circuit could be set to the level of the principle power supply voltage Vnew.

As mentioned, the DRAM circuit 500 includes the I/O circuit 510, the peripheral circuit 520, and the DRAM core circuit 530. The peripheral circuit 520 at least comprises command/address decoders and/or other circuits which includes transistors, and the DRAM core circuit 530 at least comprising cell arrays and/or other related circuits which includes transistors. Based on the present invention, an operation supply voltage to a drain side of a transistor in the peripheral circuit could be the same as the voltage level of the principle power supply voltage source Vnew to the DRAM chip. Furthermore, an operation supply voltage to a drain side of a transistor in the DRAM core circuit which is not the access transistor could be the same as the voltage level of the principle power supply voltage source to the DRAM chip. Of course, the voltage level corresponding to the signal ONE or signal High utilized in the DRAM chip could be the same as the voltage level of the principle power supply voltage source Vnew to the DRAM chip.

Figure 9C:
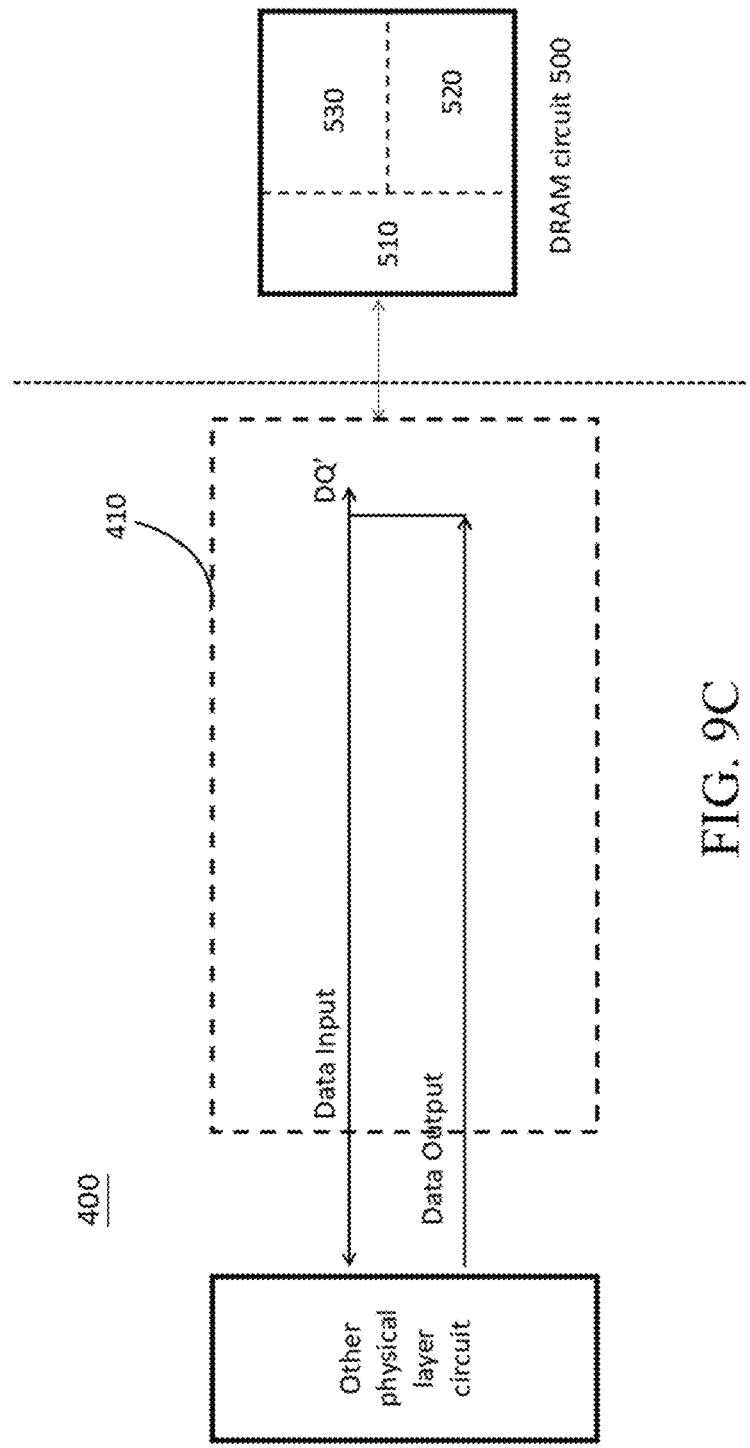
FIG. 9C illustrates portions of function blocks for the I/O physical circuit of the physical layer circuit according to the present invention.

Similarly, according to the present invention as shown in FIG. 9C, the I/O physical circuit 410 of the physical layer circuit 400 could remove the previously mentioned output level converting circuit (to level up or level down the voltage level of the output signal) and the input comparator as well. The signal of input/output data to or from other physical layer circuit (such as logic physical circuit 420) is not necessarily converted or compared by the I/O circuit 410 of the physical layer circuit 400. Furthermore, the signal swing of input/output data to or from other physical layer circuit could be set to the level of the principle power supply voltage Va' (that is, Vnew).

Therefore, based on the present invention, the levels of the principle power supply voltages to the logic circuit 300, the physical layer circuit 400, and the DRAM circuit 500 could be all the same. In the event the DRAM circuit 500 is positioned in a DRAM chip, the physical layer circuit 400 and the logic circuit 300 are positioned in another logic chip separate from the DRAM chip, then the level of the principle power supply voltage to the DRAM chip is the same as that of the principle power supply voltage to the logic chip.

It is possible that the I/O physical circuit 410 of the physical layer circuit 400 and the DRAM circuit 500 are positioned in a DRAM chip, and the logic physical circuit 420 of the physical layer circuit 400 and the logic circuit 300 are positioned in another logic chip. Again, the level of the principle power supply voltage to the DRAM chip is the same as that of the principle power supply voltage to the logic chip.

In another case, when the logic circuit 300, the physical layer circuit 400, and the DRAM circuit 500 are respectively positioned in a logic chip, a based chip (or interposer), and a DRAM chip, then the level of the principle power supply voltage to the DRAM chip is the same as that of the principle power supply voltage to the based chip, and the same as that of the principle power supply voltage to the logic chip as well.

To summarize the statements mentioned above, this invention discloses sustainable DRAM with unified principle power supply voltage which is unified with the logic circuit. A first sustaining voltage which is higher than the voltage level of signal ONE (or signal high) could be restored or stored to the DRAM storage cell before the access transistor of the DRAM storage cell is OFF (or the word-line coupled to the DRAM storage cell is OFF). After the turn off of the access transistor, the storage capacitor can sustain for a longer period compared with conventional DRAM structure even if there is leakage current through the access transistor. Since leakage problem in the DRAM circuit is relieved, the principle power supply voltage to DRAM chip could be reduced down to 1.0V~0.5V or lower, even the exist of the slowed-down DRAM technology migration. Thus, the principle power supply voltage to DRAM chip would be the same or substantially the same as the principle power supply voltage to logic circuit chip. Moreover, those compatibility of the supply voltages between DRAM chip and the logic chip leads to optimization of the energy efficiency and performance synchronization, not only increasing operation speed, but also saving the die area and power.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A DRAM chip configured to couple with an external logic circuit chip and to couple with a principle power supply voltage source, comprising:
a first sustaining voltage generator producing a first voltage level which is higher than a voltage level corresponding to a signal ONE utilized in the DRAM chip; and
a DRAM core circuit with a DRAM cell comprising an access transistor and a storage capacitor;
wherein the storage capacitor of the DRAM cell is configured to selectively coupled to the first sustaining voltage generator;
wherein a voltage level of the principle power supply voltage source to the DRAM chip is the same or substantially the same as that of a principle power supply voltage source to the external logic circuit chip, wherein the DRAM chip is physically separate from the external logic circuit chip, the DRAM chip and the external logic circuit chip are two different semiconductor chips, and the voltage level of the principle power supply voltage source to the DRAM chip is not greater than 0.9V, wherein during write operation of the signal ONE to the DRAM cell, the storage capacitor is stored the first voltage level, and the voltage level corresponding to the signal ONE utilized in the DRAM chip is equal to the voltage level of the principle power supply voltage source;
wherein a process node of the external logic circuit chip is smaller than that of the DRAM chip.

2. The DRAM chip in claim 1, further comprising an I/O circuit and a peripheral circuit between the I/O circuit and the DRAM core circuit, wherein an operation supply voltage to a drain side of a transistor in the peripheral circuit is the same as the voltage level of the principle power supply voltage source to the DRAM chip.

3. The DRAM chip in claim 2, where an operation supply voltage to a drain side of a transistor in the DRAM core circuit which is not the access transistor is the same as the voltage level of the principle power supply voltage source to the DRAM chip.

4. The DRAM chip in claim 3, where the voltage level corresponding to the signal ONE utilized in the DRAM chip is the same as the voltage level of the principle power supply voltage source to the DRAM chip.

5. The DRAM chip in claim 1, further comprising an I/O circuit and a peripheral circuit which is between the I/O circuit and the DRAM core circuit, the I/O circuit being without an input comparator circuit and an output level converting circuit.

6. The DRAM chip in claim 1, wherein the voltage level of the external principle power supply voltage source to the DRAM chip is between 0.9V~0.5V.

7. The DRAM chip in claim 1, further comprising a word line coupled to a gate terminal of the access transistor, wherein the word-line is selected to turn on the access transistor for a first period and a second period which is after the first period, and the first sustaining voltage generator is electrically coupled to the storage capacitor of the DRAM cell during the second period.

8. The DRAM chip in claim 7, wherein the first period is an access operation period, and the second period is a restore phase period.

9. The DRAM chip in claim 8, wherein a kicking charge source is electrically coupled to a bit line of the DRAM chip during the access operation period.

10. A DRAM chip configured to couple with an external logic circuit chip and with a principle power supply voltage source, comprising:
a DRAM core circuit with a DRAM cell comprising an access transistor and a storage capacitor;
an I/O circuit configured to couple to the external logic circuit chip and being without an input comparator circuit and an output level converting circuit; and
a peripheral circuit between the I/O circuit and the DRAM core circuit;
wherein a voltage level of the principle power supply voltage source to the DRAM chip is the same or substantially the same as that of a principle power supply voltage source to the external logic circuit chip, the voltage level of the principle power supply voltage source to the DRAM chip is not greater than 0.9V, and the DRAM chip is physically separate from the logic circuit chip;
wherein the DRAM chip and the external logic circuit chip are two different semiconductor chips, and a process node of the external logic circuit chip is smaller than that of the DRAM chip;
wherein during write operation of a signal ONE to the DRAM cell, the storage capacitor is stored a first voltage level generated by a first sustaining voltage generator comprised in the DRAM chip, the first voltage level is higher than a voltage level corresponding to the signal ONE utilized in the DRAM chip, and the voltage level corresponding to the signal ONE utilized in the DRAM chip is equal to the voltage level of the principle power supply voltage source.

11. The DRAM chip in claim 10, wherein an operation supply voltage to a drain side of a transistor in the peripheral circuit is the same as the voltage level of the principle power supply voltage source to the DRAM chip.

12. The DRAM chip in claim 11, where an operation supply voltage to a drain side of a transistor in the DRAM core circuit which is not the access transistor is the same as the voltage level of the principle power supply voltage source to the DRAM chip.

13. The DRAM chip in claim 12, where the voltage level corresponding to the signal ONE utilized in the DRAM chip is the same as the voltage level of the principle power supply voltage source to the DRAM chip.

14. The DRAM chip in claim 10, further comprising:
a first sustaining voltage generator producing a first voltage level which is higher than a voltage level corresponding to a signal ONE utilized in the DRAM chip; and
a word line coupled to a gate terminal of the access transistor, wherein the word-line is selected to turn on the access transistor for a first period and a second period which is after the first period, and the first sustaining voltage generator is electrically coupled to the storage capacitor of the DRAM cell during the second period.

15. The DRAM chip in claim 14, wherein the first period is an access operation period, the second period is a restore phase period.

16. A memory system, comprising:
a DRAM chip, comprising:
a DRAM core circuit with a DRAM cell comprising an access transistor and a storage capacitor; and
an I/O circuit without an input comparator circuit and an output level converting circuit; and a logic circuit chip electrically coupled to the DRAM chip, wherein the DRAM chip is physically separate from the logic circuit chip;

wherein a voltage level of a principle power supply voltage source to the DRAM chip is the same or substantially the same as that of a principle power supply voltage source to the logic chip; wherein a voltage level of the principle power supply voltage source to the DRAM chip is not greater than 0.9V;

wherein the DRAM chip and the external logic circuit chip are two different semiconductor chips, and a process node of the external logic circuit chip is smaller than that of the DRAM chip;

wherein during write operation of a signal ONE to the DRAM cell, the storage capacitor is stored a first voltage level generated by a first sustaining voltage generator comprised in the DRAM chip, the first voltage level is higher than a voltage level corresponding to the signal ONE utilized in the DRAM chip, and the voltage level corresponding to the signal ONE utilized in the DRAM chip is equal to the voltage level of the principle power supply voltage source.

17. The memory system in claim 16, wherein the DRAM chip includes a DRAM circuit, the logic circuit chip includes a logic circuit and a physical layer circuit; wherein the principle power supply voltage source to the DRAM chip is supplied to the DRAM circuit, and the principle power supply voltage source to the logic circuit chip is supplied to the logic circuit and the physical layer circuit.

18. The memory system in claim 16, further comprising a based chip electrically coupled to the DRAM chip; wherein the voltage level of the principle power supply voltage source to the DRAM chip is the same or substantially the same as that of a principle power supply voltage source to the based chip.

19. The memory system in claim 18, wherein the DRAM chip includes a DRAM circuit, the logic circuit chip includes a logic circuit, and the based chip includes a physical layer circuit; wherein the principle power supply voltage source to the DRAM chip is supplied to the DRAM circuit, the principle power supply voltage source to the logic circuit chip is supplied to the logic circuit, and the principle power supply voltage source to the based chip is supplied to the physical layer circuit.

20. The memory system in claim 16, the DRAM chip comprising a DRAM cell and a first sustaining voltage generator, the DRAM cell comprising a storage capacitor and an access transistor, and the first sustaining voltage generator producing a first voltage level which is higher than a voltage level corresponding to a signal ONE utilized in the DRAM chip; wherein the first sustaining voltage generator is coupled to the storage capacitor of the DRAM cell before the access transistor of the DRAM cell is turned off.

21. The memory system in claim 20, the DRAM chip further comprising a peripheral circuit between the I/O circuit and the DRAM cell.

22. The memory system in claim 16, further comprising a physical layer circuit with an I/O physical circuit, and the I/O physical circuit being without an input comparator circuit and an output level converting circuit.

* * * * *